(12) United States Patent
Kamatani

(10) Patent No.: US 10,160,444 B2
(45) Date of Patent: Dec. 25, 2018

(54) VEHICLE

(71) Applicant: TOYOTA JIDOSHA KABUSHIKI KAISHA, Toyota-shi, Aichi-ken (JP)

(72) Inventor: Hideki Kamatani, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/729,041

(22) Filed: Oct. 10, 2017

(65) Prior Publication Data
US 2018/0111601 A1    Apr. 26, 2018

(30) Foreign Application Priority Data

Oct. 26, 2016   (JP) .................................. 2016-209658

(51) Int. Cl.
*B60W 20/00* (2016.01)
*B60W 20/14* (2016.01)
(Continued)

(52) U.S. Cl.
CPC ............... *B60W 20/14* (2016.01); *B60K 6/46* (2013.01); *B60L 7/16* (2013.01); *B60L 11/1818* (2013.01); *B60L 11/1861* (2013.01); *B60W 10/06* (2013.01); *B60W 10/08* (2013.01); *B60W 10/26* (2013.01); *B60W 20/40* (2013.01); *G01R 31/3679* (2013.01); *H01M 10/425* (2013.01); *H01M 10/44* (2013.01); *H01M 10/48* (2013.01); *B60K 6/24* (2013.01); *B60K 6/26* (2013.01); *B60K 6/28* (2013.01); *B60K 6/365* (2013.01);
(Continued)

(58) Field of Classification Search
CPC ...... B60W 20/14; B60W 20/40; B60W 10/08; B60W 10/06; B60K 6/48; B60K 6/46
See application file for complete search history.

(56) References Cited

U.S. PATENT DOCUMENTS

2007/0093359 A1* 4/2007 Kobayashi ............... B60K 6/48
477/107
2011/0161025 A1* 6/2011 Tomura .............. G01R 31/3651
702/63
(Continued)

FOREIGN PATENT DOCUMENTS

JP    2010-060406 A    3/2010
JP    2013-125607 A    6/2013
(Continued)

*Primary Examiner* — Hau V Phan
(74) *Attorney, Agent, or Firm* — Oliff PLC

(57) ABSTRACT

A vehicle includes an electric power storage device, an electric motor, and an electronic control unit. The electronic control unit is configured to control charging and discharging of the electric power storage device such that a state of charge becomes a target state of charge, to determine whether or not a degree of deterioration of the electric power storage device due to unevenness in salt concentration is equal to or larger than a predetermined degree, when the degree of deterioration is equal to or larger than the predetermined degree and the state of charge is equal to or less than a predetermined requested state of charge, to set the target state of charge such that the target state of charge increases monotonically, and to set an increase amount or an increase rate of the monotonic increase to be larger as the degree of deterioration is larger.

6 Claims, 13 Drawing Sheets

(51) Int. Cl.
  *B60K 6/46*   (2007.10)
  *B60L 7/16*   (2006.01)
  *B60L 11/18*  (2006.01)
  *B60W 10/06*  (2006.01)
  *B60W 10/08*  (2006.01)
  *B60W 10/26*  (2006.01)
  *B60W 20/40*  (2016.01)
  *G01R 31/36*  (2006.01)
  *H01M 10/42*  (2006.01)
  *H01M 10/44*  (2006.01)
  *H01M 10/48*  (2006.01)
  *B60K 6/24*   (2007.10)
  *B60K 6/26*   (2007.10)
  *B60K 6/28*   (2007.10)
  *B60K 6/365*  (2007.10)

(52) U.S. Cl.
  CPC ....... *B60L 2210/10* (2013.01); *B60L 2210/30* (2013.01); *B60L 2240/12* (2013.01); *B60L 2240/421* (2013.01); *B60L 2240/423* (2013.01); *B60L 2240/441* (2013.01); *B60L 2240/443* (2013.01); *B60L 2240/54* (2013.01); *B60W 2510/0638* (2013.01); *B60W 2510/0657* (2013.01); *B60W 2510/081* (2013.01); *B60W 2510/083* (2013.01); *B60W 2510/244* (2013.01); *B60W 2520/10* (2013.01); *B60W 2540/10* (2013.01); *B60W 2540/12* (2013.01); *B60W 2710/0644* (2013.01); *B60W 2710/0666* (2013.01); *B60W 2710/0677* (2013.01); *B60W 2710/081* (2013.01); *B60W 2710/083* (2013.01); *B60W 2710/244* (2013.01); *G01R 31/3675* (2013.01); *H01M 2010/4271* (2013.01); *H01M 2220/20* (2013.01); *Y10S 903/905* (2013.01); *Y10S 903/906* (2013.01); *Y10S 903/907* (2013.01); *Y10S 903/91* (2013.01); *Y10S 903/93* (2013.01)

(56) References Cited

U.S. PATENT DOCUMENTS

| | | | |
|---|---|---|---|
| 2011/0270477 A1* | 11/2011 | Ueki | H01M 10/0525 701/22 |
| 2013/0282316 A1* | 10/2013 | Goto | G01R 31/3679 702/63 |
| 2014/0159736 A1* | 6/2014 | Morimoto | G01R 31/3679 324/426 |
| 2014/0176085 A1* | 6/2014 | Maruno | G01R 31/3679 320/162 |
| 2014/0303819 A1 | 10/2014 | Aoki et al. | |
| 2015/0295293 A1* | 10/2015 | Kawashima | H01M 8/0494 429/9 |
| 2016/0236581 A1* | 8/2016 | Tashiro | H02J 7/0029 |
| 2016/0351976 A1* | 12/2016 | Kawahara | H01M 10/48 |
| 2016/0362099 A1 | 12/2016 | Obata et al. | |

FOREIGN PATENT DOCUMENTS

| | | |
|---|---|---|
| JP | 2014-201249 A | 10/2014 |
| JP | 2016-062470 A | 4/2016 |
| JP | 2017-001498 A | 1/2017 |

\* cited by examiner

VEHICLE

INCORPORATION BY REFERENCE

The disclosure of Japanese Patent Application No. 2016-209658 filed on Oct. 26, 2016 including the specification, drawings and abstract is incorporated herein by reference in its entirety.

BACKGROUND

1. Technical Field

The present disclosure relates to a vehicle, and in particular, to a vehicle in which an electric power storage device, an electric motor, and an electronic control unit are mounted.

2. Description of Related Art

In the related art, a vehicle in which an electric power storage device, such as a lithium-ion battery including a positive electrode formed of a material capable of storing and discharging ions, a negative electrode formed of a material capable of storing and discharging ions, and a nonaqueous electrolyte, is mounted is known. For example, Japanese Unexamined Patent Application Publication No. 2013-125607 (JP 2013-125607 A) discloses that charging and discharging of a battery are controlled such that charging and discharging electric power of the battery does not exceed an upper limit value, and in a case where an evaluation value (integrated value) indicating a degree of deterioration of the battery due to unevenness in salt concentration of the battery exceeds a threshold, charging electric power of the battery is limited by decreasing the upper limit value. Since it is known that deterioration (high rate deterioration) of the battery due to unevenness in salt concentration is caused by charging with a large current, recovery of deterioration of the battery is achieved by limiting charging of the battery.

SUMMARY

However, in the technique described in JP 2013-125607 A, when the state of charge (SOC) is low, even if charging of the battery is limited, deterioration of the battery may not be sufficiently recovered. In a state in which the state of charge is low, the expansion and contraction of the negative electrode increase, and the electrolyte in a cell is likely to be extruded. For this reason, a salt concentration difference within a cell surface is likely to occur, and deterioration of the battery is likely to be accelerated.

A vehicle of the present disclosure more appropriately recovers deterioration of an electric power storage device due to unevenness in salt concentration.

An aspect of the present disclosure relates to a vehicle including an electric power storage device, an electric motor, and an electronic control unit. The electric motor is configured to generate power for traveling accompanied with discharging of the electric power storage device and to perform regenerative braking accompanied with charging of the electric power storage device. The electronic control unit is configured to control charging and discharging of the electric power storage device such that a state of charge that is a ratio of an electric power storage amount stored in the electric power storage device to a total capacity of the electric power storage device becomes a target state of charge. The electronic control unit is configured to determine whether or not a degree of deterioration of the electric power storage device due to unevenness in salt concentration is equal to or larger than a predetermined degree. The electronic control unit is configured to, when the degree of deterioration is equal to or larger than the predetermined degree and the state of charge is equal to or less than a predetermined requested state of charge, set the target state of charge such that the target state of charge increases monotonically. The electronic control unit is configured to set an increase amount or an increase rate of the monotonic increase to be larger as the degree of deterioration is larger.

According to the aspect of the present disclosure, the inventors have recognized that, in a case where the electric power storage device is deteriorated due to unevenness in salt concentration, even if charging and discharging electric power is limited, increasing the state of charge enhances an effect of recovering deterioration. For this reason, when the degree of deterioration of the electric power storage device is equal to or larger than the predetermined degree, the target state of charge is monotonically increased, thereby quickly recovering deterioration of the electric power storage device. Then, when the degree of deterioration of the electric power storage device is small, since the increase amount or the increase rate in a case of monotonically increasing the target state of charge is made small, it is possible to suppress a rapid increase in the target state of charge, and to reduce a sense of discomfort given to a driver due to charging and discharging control of the electric power storage device using the target state of charge. When the degree of deterioration of the electric power storage device is large, since the increase amount or the increase rate in a case of monotonically increasing the target state of charge is made large, it is possible to enhance the effect of recovering deterioration of the electric power storage device. As a result, it is possible to more appropriately recover deterioration of the electric power storage device due to unevenness in salt concentration.

In the vehicle according to the aspect of the present disclosure, the electronic control unit may be configured to set the increase amount to be larger as the degree of deterioration is larger. The electronic control unit may be configured to set a larger value out of a previous value of the target state of charge and a value obtained by adding the set increase amount to a current state of charge as a new target state of charge.

According to the aspect of the present disclosure, the increase amount is appropriately determined, whereby it is possible to monotonically increase the target state of charge while preventing the difference between the target state of charge and the current state of charge from being made excessively large, and to further reduce a sense of discomfort given to the driver due to charging and discharging control of the electric power storage device using the target state of charge.

In the vehicle according to the aspect of the present disclosure, the electronic control unit may be configured to, when regenerative braking of the electric motor is requested, set the target state of charge to monotonically increase with a given increase amount from a target state of charge set immediately before a start of the regenerative braking until the request of the regenerative braking is released.

According to the aspect of the present disclosure, it is possible to quickly increase the state of charge by charging the electric power storage device with electric power generated by the regenerative braking of the electric motor, and to suppress a rapid increase in the target state of charge before and after the start of the regenerative braking to reduce a sense of discomfort given to the driver due to charging and discharging control of the electric power storage device.

In the vehicle according to the aspect of the present disclosure, the electronic control unit may be configured to set the target state of charge to monotonically increase with a smaller increase amount or a smaller increase rate as a difference between a current state of charge and the requested state of charge is smaller.

According to the aspect of the present disclosure, in a case where the difference between the current state of charge and the requested state of charge is made small, it is considered that deterioration of the electric power storage device is recovered to some extent. For this reason, the increase amount or the increase rate in a case of monotonically increasing the target state of charge is made small, whereby it is possible to suppress a rapid increase in the target state of charge, and to further reduce a sense of discomfort given to the driver due to charging and discharging control of the electric power storage device using the target state of charge.

The vehicle according to the present disclosure may further include an internal combustion engine. The electronic control unit may be configured to, when the degree of deterioration is less than the predetermined degree, as a traveling mode, selectively set either of an electrically powered traveling priority mode in which electrically powered traveling is given priority over hybrid traveling or a hybrid traveling priority mode in which the hybrid traveling is given priority over the electrically powered traveling. The electrically powered traveling may be a traveling state in which traveling is performed with power input and output from the electric motor exclusively in a state in which operation of the internal combustion engine is stopped. The hybrid traveling may be a traveling state in which traveling is performed using power from the internal combustion engine and power input and output from the electric motor. The electronic control unit may be configured to, when the degree of deterioration is equal to or larger than the predetermined degree, as the traveling mode, set the hybrid traveling priority mode.

According to the aspect of the present disclosure, in a case where the degree of deterioration of the electric power storage device is equal to or larger than the predetermined degree, it is possible to suppress discharging of the electric power storage device, and to quickly increase the state of charge to recover deterioration of the electric power storage device.

The vehicle according to the aspect of the present disclosure may further include an internal combustion engine. The electronic control unit may be configured to, in a case where traveling is enabled with the hybrid traveling, set requested traveling power requested for traveling based on an accelerator operation amount. The electronic control unit may be configured to set requested charging and discharging power requested for charging and discharging the electric power storage device based on a current state of charge and the target state of charge. The electronic control unit may be configured to set requested engine power requested for the internal combustion engine based on the requested traveling power and the requested charging and discharging power. The electronic control unit may be configured to control the internal combustion engine and the electric motor such that the requested engine power is output from the internal combustion engine and traveling is performed with the requested traveling power. The electronic control unit may be configured to, when the degree of deterioration is equal to or larger than the predetermined degree, set the requested charging and discharging power such that charging power in a case of charging the electric power storage device becomes larger than when the degree of deterioration is less than the predetermined degree.

According to the aspect of the present disclosure, in a case where the degree of deterioration of the electric power storage device is equal to or larger than the predetermined degree, it is possible to charge the electric power storage device with comparatively large electric power, and to quickly increase the state of charge to recover deterioration of the electric power storage device.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Next, a mode for carrying out the present disclosure will be described in connection with an example.

Figure 1:
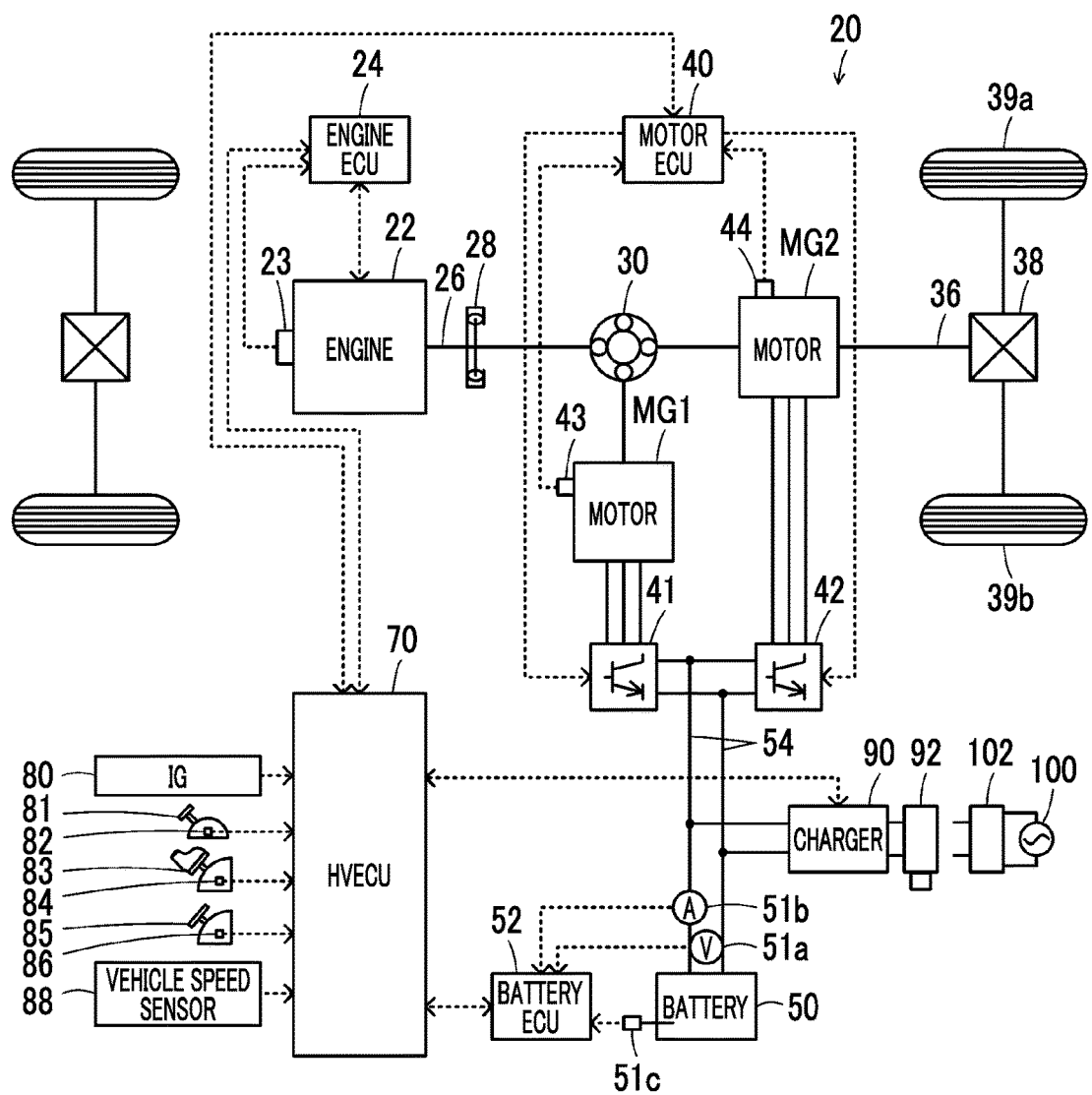
FIG. 1 is a configuration diagram showing the outline of the configuration of a hybrid vehicle as an example of the present disclosure.

FIG. 1 is a configuration diagram showing the outline of the configuration of a hybrid vehicle 20 as an example of the present disclosure. As shown in the drawing, the hybrid vehicle 20 of the example includes an engine 22, a planetary gear 30, motors MG1, MG2, inverters 41, 42, a battery 50, a charger 90, and an electronic control unit for hybrid (hereinafter, referred to as an "HVECU") 70.

The engine 22 is constituted as an internal combustion engine that outputs power with gasoline, diesel, or the like as fuel. The operation of the engine 22 is controlled by an electronic control unit for an engine (hereinafter, referred to as an "engine ECU") 24.

Though not shown, the engine ECU 24 is constituted as a microprocessor centering on a CPU, and includes, in addition to the CPU, a ROM that stores a processing program, a RAM that temporarily stores data, an input/output port, and a communication port. Signals from various sensors for controlling the operation of the engine 22 are input to the engine ECU 24 through the input port. As the signals that are input to the engine ECU 24, for example, a crank angle θcr from a crank position sensor 23 that detects a rotation position of a crankshaft 26 of the engine 22, a throttle valve opening degree TH from a throttle valve position sensor that detects a position of a throttle valve, and the like can be exemplified. Various control signals for controlling the operation of the engine 22 are output from the engine ECU 24 through the output port. As the signals that are output from the engine ECU 24, for example, a drive control signal to a throttle motor that adjusts the position of the throttle valve, a drive control signal to a fuel injection valve, a drive control signal to an ignition coil integrated with an igniter, and the like can be exemplified. The engine ECU 24 is connected to the HVECU 70 through the communication port, controls the operation of the engine 22 according to a control signal from the HVECU 70, and outputs data relating to an operation state of the engine 22 to the HVECU 70 as needed. The engine ECU 24 calculates a rotation speed of the crankshaft 26, that is, a rotation speed Ne of the engine 22 based on the crank angle θcr from the crank position sensor 23.

The planetary gear 30 is constituted as a single-pinion type planetary gear mechanism. A rotor of the motor MG1 is connected to a sun gear of the planetary gear 30. A drive shaft 36 coupled to drive wheels 39a, 39b through a differential gear 38 is connected to a ring gear of the planetary gear 30. The crankshaft 26 of the engine 22 is connected to a carrier of the planetary gear 30 through a damper 28.

The motor MG1 is constituted as, for example, a synchronous motor generator, and as described above, the rotor is connected to the sun gear of the planetary gear 30. The motor MG2 is constituted as, for example, a synchronous motor generator, and a rotor is connected to the drive shaft 36. The inverters 41, 42 are connected to the battery 50 through an electric power line 54. The motors MG1, MG2 are rotationally driven through switching control of a plurality of switching elements (not shown) of the inverters 41, 42 by an electronic control unit for a motor (hereinafter, referred to as a "motor ECU") 40.

Though not shown, the motor ECU 40 is constituted as a microprocessor centering on a CPU, and includes, in addition to the CPU, a ROM that stores a processing program, a RAM that temporarily stores data, an input/output port, and a communication port. Signals from various sensors for controlling the drive of the motors MG1, MG2 are input to the motor ECU 40 through the input port. As the signals that are input to the motor ECU 40, for example, rotation positions θm1, θm2 from rotation position detection sensors 43, 44 that detect rotation positions of the rotors of the motors MG1, MG2, phase currents from current sensors that detect currents flowing in the phases of the motors MG1, MG2, and the like can be exemplified. A switching control signal to the switching elements (not shown) of the inverters 41, 42, and the like are output from the motor ECU 40 through the output port. The motor ECU 40 is connected to the HVECU 70 through the communication port, and controls the drive of the motors MG1, MG2 according to a control signal from the HVECU 70, and outputs data relating to drive states of the motors MG1, MG2 to the HVECU 70 as needed. The motor ECU 40 calculates rotation speeds Nm1, Nm2 of the motors MG1, MG2 based on the rotation positions θm1, θm2 of the rotors of the motors MG1, MG2 from the rotation position detection sensors 43, 44.

The battery 50 is constituted as, for example, a known lithium-ion secondary battery having a positive electrode that contains a positive electrode active material capable of storing and discharging ions, a negative electrode that contains a negative electrode active material capable of storing and discharging ions, and a nonaqueous electrolyte that contains lithium salt. The battery 50 is connected to the inverters 41, 42 through the electric power line 54. The battery 50 is managed by an electronic control unit for a battery (hereinafter, referred to as a "battery ECU") 52.

Though not shown, the battery ECU 52 is constituted as a microprocessor centering on a CPU, and includes, in addition to the CPU, a ROM that stores a processing program, a RAM that temporarily stores data, an input/output port, and a communication port. Signals from various sensors for managing the battery 50 are input to the battery ECU 52 through the input port. As the signals that are input to the battery ECU 52, for example, a battery voltage Vb from a voltage sensor 51a provided between terminals of the battery 50, a battery current Ib from a current sensor 51b attached to an output terminal of the battery 50, a battery temperature Tb from a temperature sensor 51c attached to the battery 50, and the like can be exemplified. The battery ECU 52 is connected to the HVECU 70 through the communication port, and outputs data relating to a state of the battery 50 to the HVECU 70 as needed. The battery ECU 52 calculates a state of charge SOC based on an integrated value of the battery current Ib from the current sensor 51b. The state of charge SOC is the ratio of the capacity of electric power dischargeable from the battery 50 to the total capacity of the battery 50. The battery ECU 52 also calculates input and output limits Win, Wout as allowable maximum charging and discharging electric power for allowing charging and discharging of the battery 50 based on the battery temperature Tb and the state of charge SOC.

The charger 90 is attached to the electric power line 54 to which the battery 50 is connected, and converts alternating-current electric power from an external power supply 100 to direct-current electric power and charges the battery 50 by connecting a vehicle side connector 92 to an external power supply side connector 102 of the external power supply 100. Though not shown, the charger 90 includes a relay for charging that connects or disconnects the electric power line 54 and the vehicle side connector 92, an AC/DC converter that converts alternating-current electric power from the external power supply 100 to direct-current electric power, a DC/DC converter that converts a voltage of direct-current electric power converted by the AC/DC converter and supplies the voltage to the electric power line 54 side, and the like.

Though not shown, the HVECU 70 is constituted as a microprocessor centering on a CPU, and includes, in addition to the CPU, a ROM that stores a processing program, a RAM that temporarily stores data, an input/output port, and a communication port. Signals from various sensors are input to the HVECU 70 through the input port. As the signals that are input to the HVECU 70, for example, an ignition signal from an ignition switch 80, a shift position SP from a shift position sensor 82 that detects an operation position of a shift lever 81, an accelerator operation amount Acc from an accelerator pedal position sensor 84 that detects a depression amount of an accelerator pedal 83, a brake pedal position BP from a brake pedal position sensor 86 that detects a depression amount of a brake pedal 85, a vehicle speed V from a vehicle speed sensor 88, and the like can be exemplified. A control signal to the charger 90, and the like are output from the HVECU 70 through the output port. As described above, the HVECU 70 is connected to the engine ECU 24, the motor ECU 40, and the battery ECU 52 through the communication port, and exchanges various control signals or data with the engine ECU 24, the motor ECU 40, and the battery ECU 52.

In the hybrid vehicle 20 of the example configured as above, requested torque to be output to the drive shaft 36 is calculated based on the accelerator operation amount Acc corresponding to the depression amount of the accelerator pedal 83 by the driver and the vehicle speed V, and the operations of the engine 22, the motor MG1, and the motor MG2 are controlled such that requested power corresponding to the requested torque is output to the drive shaft 36. The operation control of the engine 22, the motor MG1, and the motor MG2 includes torque conversion operation mode in which the operation of the engine 22 is controlled such that power corresponding to requested power is output from the engine 22 and the operations of the motor MG1 and the motor MG2 are controlled such that all of power output from the engine 22 is subjected to torque conversion by the planetary gear 30, the motor MG1, and the motor MG2 and is output to the drive shaft 36, a charging and discharging operation mode in which the operation of the engine 22 is controlled such that power corresponding to the sum of requested power and electric power for charging and discharging the battery 50 is output from the engine 22 and the drive of the motor MG1 and the motor MG2 is controlled such that all or a part of power output from the engine 22 accompanied with charging and discharging of the battery 50 is subjected to torque conversion by the planetary gear 30, the motor MG1, and the motor MG2 and requested power is output to the drive shaft 36, a motor operation mode in which operation control is performed such that the operation of the engine 22 is stopped and power corresponding to requested power from the motor MG2 is output to the drive shaft 36, and the like. Since both of the torque conversion operation mode and the charging and discharging operation mode are a mode in which the engine 22 and the motors MG1, MG2 are controlled such that requested power is output to the drive shaft 36 accompanied with the operation of the engine 22, hereinafter, both modes can be collectively regarded as an engine operation mode.

The hybrid vehicle 20 of the example performs charging and discharging control of the battery 50 to decrease the state of charge SOC of the battery 50 during traveling to an extent that is sufficient for a start of the engine 22 when reaching home or a charging point set in advance. After a system stop of the vehicle at home or the charging point set in advance, the vehicle side connector 92 of the charger 90 is connected to the external power supply side connector 102 of the external power supply 100, and the DC/DC converter and the AC/DC converter (not shown) of the charger 90 are controlled to bring the battery 50 into a full charge state or a predetermined charge state lower than the full charge state with electric power from the external power supply 100.

Figure 2:
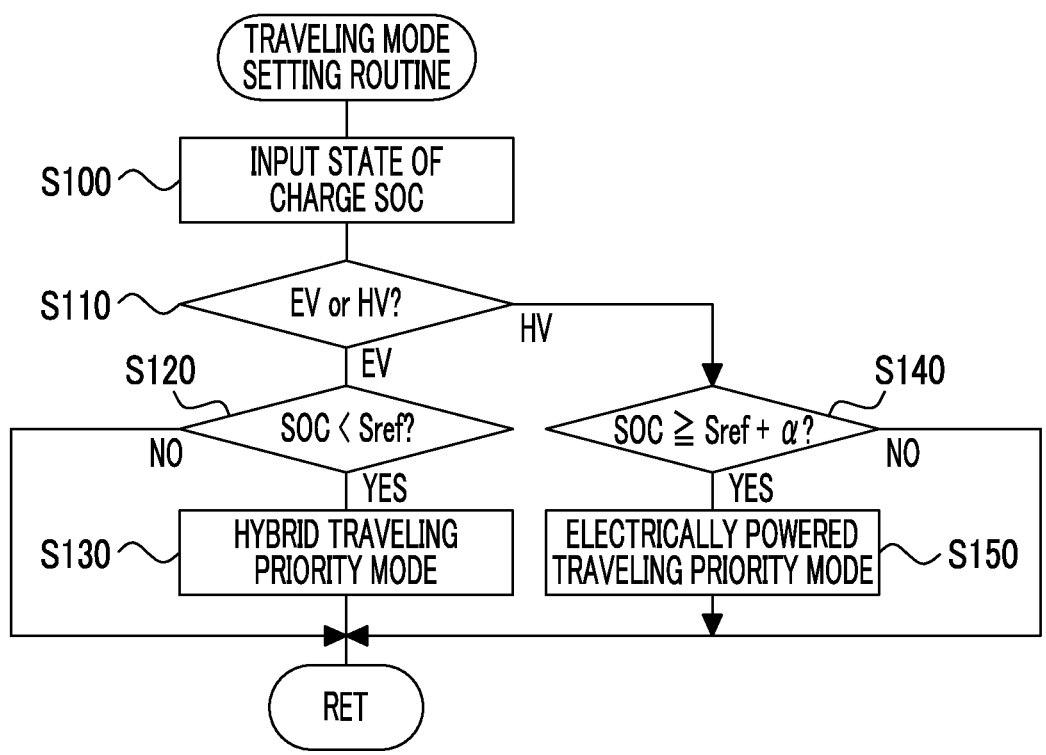
FIG. 2 is a flowchart showing an example of a traveling mode setting routine.

Next, processing for setting a traveling mode for such charging and discharging control of the battery 50 will be described. Setting of a traveling mode is performed by selecting either of an electrically powered traveling priority mode in which traveling (electrically powered traveling) in the motor operation mode is performed with priority or a hybrid traveling priority mode in which traveling (hybrid traveling) in the engine operation mode is performed with priority. FIG. 2 is a flowchart showing an example of a traveling mode setting routine that is executed by the CPU of the HVECU 70. The above-described routine is repeatedly executed at every predetermined time (for example, every several msec) after the system is started.

In a case where the traveling mode setting routine is executed, the CPU of the HVECU 70 first inputs the state of charge SOC of the battery 50 calculated by the battery ECU 52 (Step S100). Subsequently, determination is made whether a current traveling mode is an electrically powered traveling priority mode (EV) or a hybrid traveling priority mode (HV) (Step S110). In a case where determination is made that the current traveling mode is the electrically powered traveling priority mode, determination is made whether or not the input state of charge SOC of the battery 50 is less than a traveling mode switching threshold Sref (Step S120), when the state of charge SOC is equal to or larger than the traveling mode switching threshold Sref, the electrically powered traveling priority mode is maintained, when the state of charge SOC is less than the traveling mode switching threshold Sref, the hybrid traveling priority mode is set (Step S130), and the traveling mode setting routine ends. In a case where determination is made that the current traveling mode is the hybrid traveling priority mode, determination is made whether or not the input state of charge SOC of the battery 50 is equal to or larger than a value (Sref+α) obtained by adding a predetermined ratio α to the traveling mode switching threshold Sref (Step S140). When the state of charge SOC is less than the value obtained by adding the predetermined ratio α to the traveling mode switching threshold Sref, the hybrid traveling priority mode is maintained, when the state of charge SOC is equal to or larger than the value obtained by adding the predetermined ratio α to the traveling mode switching threshold Sref, the electrically powered traveling priority mode is set (Step S150), and the traveling mode setting routine ends. The predetermined ratio α provides hysteresis to prevent frequent switching of the traveling mode when the state of charge SOC is close to the traveling mode switching threshold Sref, and can be suitably set. The traveling mode switching threshold Sref is normally determined to a first state of charge Sref1 (for example, 10%, 15%, or the like) that is low to an extent that allows the start of the engine 22. However, as described below, in a case where predetermined deterioration occurs in the battery 50, the traveling mode switching threshold Sref is changed to a second state of charge Sref2 (for example, 50%, 60%, or the like) that is comparatively high until deterioration is recovered, and setting of the electrically powered traveling priority mode, that is, a decrease in the state of charge SOC due to the electrically powered traveling is suppressed.

Figure 3:
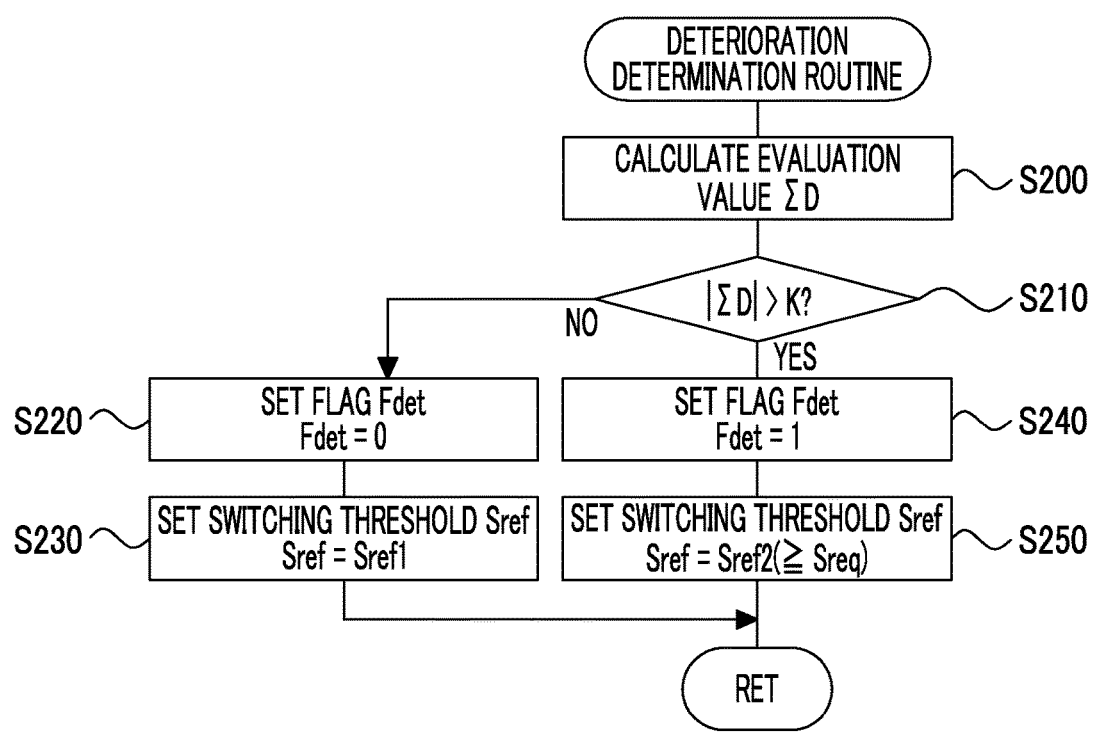
FIG. 3 is a flowchart showing an example of a deterioration determination routine.

Next, processing for determining whether or not predetermined deterioration occurs in the battery 50 will be described. FIG. 3 is a flowchart showing an example of a deterioration determination routine that is executed by the CPU of the HVECU 70. The above-described routine is repeatedly executed at every predetermined time (for example, every several msec) after the system is started. In a case where the deterioration determination routine is executed, the CPU of the HVECU 70 first calculates an evaluation value ΣD for evaluating a degree of deterioration of the battery 50 (Step S200).

The evaluation value ΣD is provided to evaluate the degree of deterioration (hereinafter, referred to as high rate deterioration) due to unevenness in salt concentration of the battery 50 accompanied with charging and discharging of the battery 50, and specifically, is calculated as follows. First, a damage amount D of the battery 50 is calculated using Expression (1). In Expression (1), D(N) is a damage amount that is calculated at the present time, D(N−1) is a damage amount calculated before a cycle Δt, A is a forgetting coefficient, B is a current coefficient, C is a limit threshold, and Ib is a battery current (a positive value for discharging and a negative value for charging).

$$D(N)=D(N-1)-A\times\Delta t\times D(N-1)+B/C\times Ib\times\Delta t \quad (1)$$

In Expression (1), a second term A×Δt×D(N−1) on a right side is a decrease term of the damage amount D, and is a component when unevenness in salt concentration is relaxed. The forgetting coefficient A is a coefficient corresponding to a diffusion rate of ions in the electrolyte, and is determined by the state of charge SOC or the battery temperature Tb. In a case where the battery temperature Tb is identical, the forgetting coefficient A is set to a smaller value when the state of charge SOC is lower. In a case where the state of charge SOC is identical, the forgetting coefficient A is set to a smaller value when the battery temperature Tb is lower.

In Expression (1), a third term B/C×Ib×Δt on the right side is an increase term of the damage amount D, and is a component when unevenness in salt concentration progresses. The current coefficient B or the limit threshold C are determined by the state of charge SOC or the battery temperature Tb. In particular, in a case where the battery temperature Tb is identical, the limit threshold C is set to a smaller value when the state of charge SOC is lower. In a case where the state of charge SOC is identical, the limit threshold C is set to a smaller value when the battery temperature Tb is lower.

In this way, the damage amount D is calculated in consideration of the progress and relaxation of unevenness in salt concentration, whereby it is possible to appropriately ascertain change (increase or decrease) in unevenness in salt concentration.

In a case where the damage amount D is calculated, the evaluation value ΣD is calculated based on the calculated damage amount D using Expression (2). In Expression (2), ΣD(N) is an evaluation value that is calculated at the present time, Σ(N−1) is an evaluation value calculated before the cycle Δt, and a is an attenuation coefficient. The attenuation coefficient a is provided considering that unevenness in salt concentration is relaxed with diffusion of ions over time, and is determined to a value larger than a value of 0 and smaller than a value of 1.

$$\Sigma D(N)=a\times\Sigma D(N-1)+D(N) \quad (2)$$

In a case where the battery 50 is over-discharged, the evaluation value ΣD increases in a positive direction (positive value) with an increase in unevenness in salt concentration due to over-discharging. In a case where the battery 50 is over-charged, the evaluation value ΣD increases in a negative direction (negative value) with an increase in unevenness in salt concentration due to over-charging. As described above, since the forgetting coefficient A and the limit threshold C become smaller values when the state of charge SOC is lower, an absolute value of B/C×Ib×Δt that is the increase term of the damage amount D becomes large, an absolute value of A×Δt×D(N−1) that is the decrease term of the damage amount D becomes small, and an absolute value of the evaluation value ΣD becomes large. That is, in a case charging and discharging of the battery 50 are repeated in a state in which the state of charge SOC is low, high rate deterioration is accelerated. In this case, since an increase in the damage amount D becomes small and a decrease in the damage amount D becomes large by increasing the state of charge SOC, it is possible to quickly recover high rate deterioration. A calculation method of the evaluation value for evaluating the degree of high rate deterioration is not limited to the above-described method, any method may be employed as long as the degree of high rate deterioration based on repetition of charging and discharging of the battery 50 with a low state of charge can be evaluated.

In a case where the evaluation value ΣD is calculated in this manner, determination is made whether or not the absolute value of the calculated evaluation value ΣD is larger than a threshold value K (Step S210). When the absolute value of the evaluation value ΣD is not larger than the threshold value K, determination is made that the degree of high rate deterioration is less than a predetermined degree, a deterioration flag Fdet is set to a value of 0 (Step S220), the traveling mode switching threshold Sref is set to the above-described first state of charge Sref1 (for example, 10%, 15%, or the like) (Step S230), and the deterioration determination routine ends. When the absolute value of the evaluation value ΣD is larger than the threshold value K, determination is made that the degree of high rate deterioration is equal to or larger than the predetermined degree, the deterioration flag Fdet is set to a value of 1 (Step S240), the traveling mode switching threshold Sref is set to the above-described second state of charge Sref2 (a value equal to or larger than a requested deterioration recovery state of charge Sreq, and for example, 50%, 60%, or the like) (Step S250), and the deterioration determination routine ends.

Figure 4A:
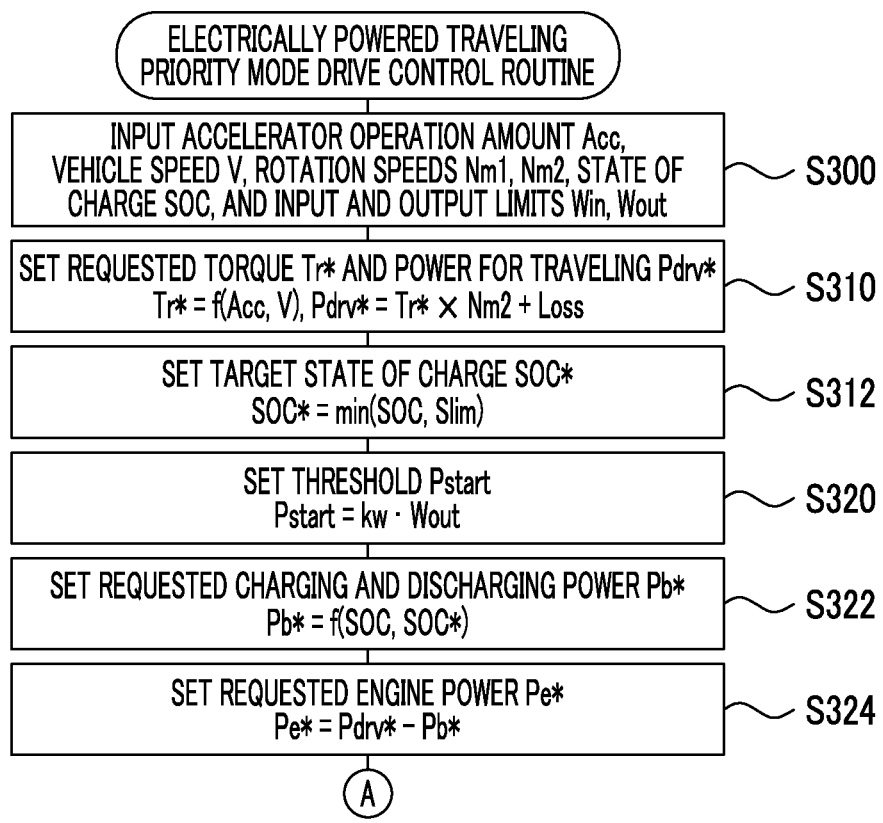
FIG. 4A is a flowchart showing an example of an electrically powered traveling priority mode drive control routine.
Figure 4B:
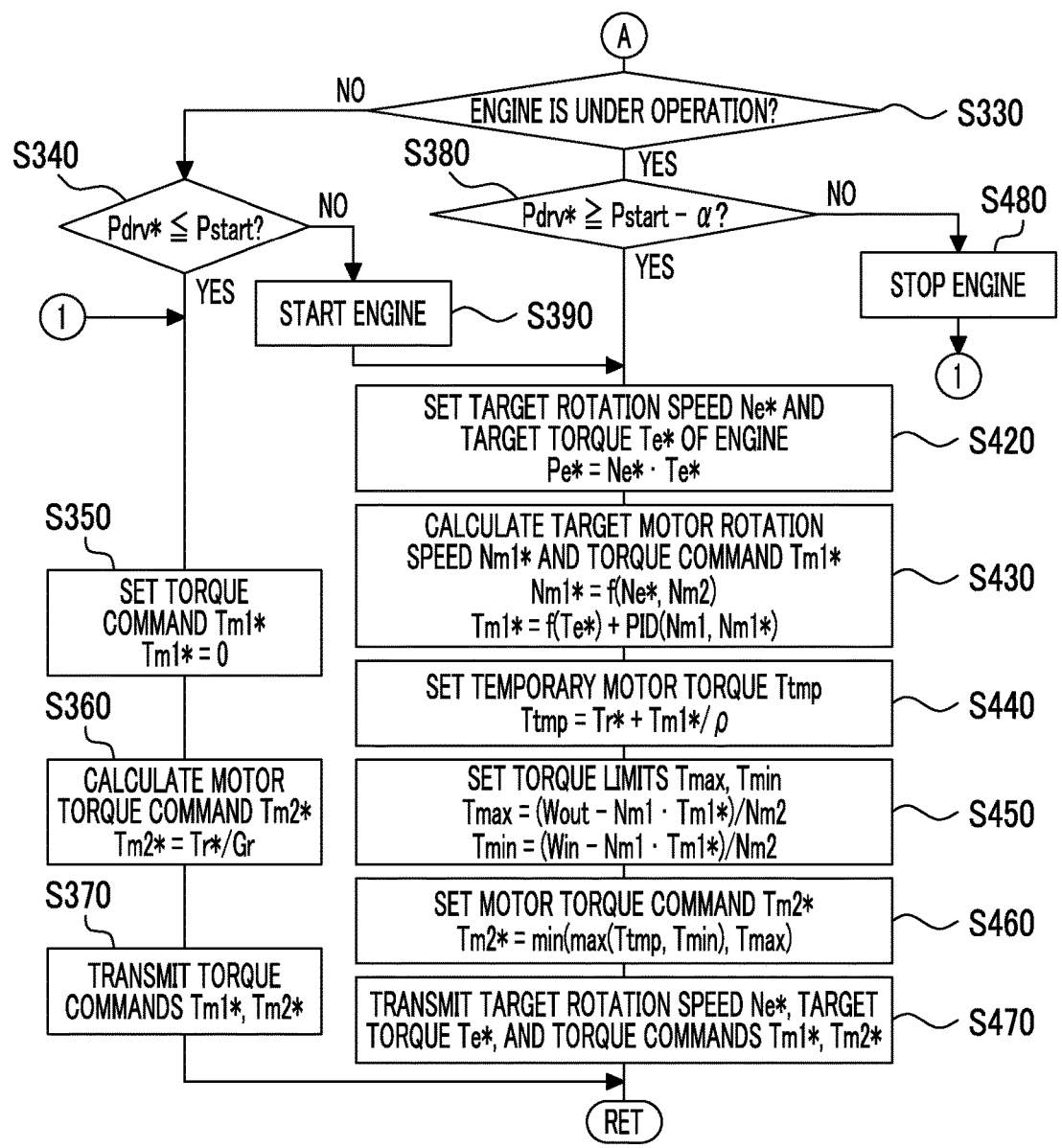
FIG. 4B is a flowchart showing an example of an electrically powered traveling priority mode drive control routine.
Figure 5A:
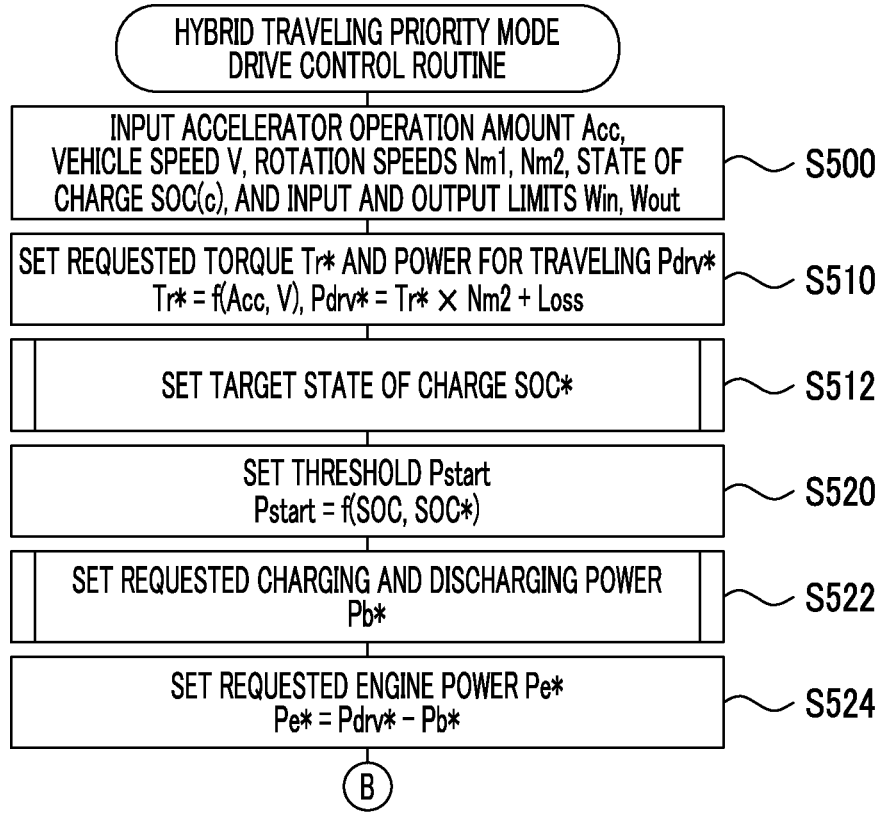
FIG. 5A is a flowchart showing an example of a hybrid traveling priority mode drive control routine.
Figure 5B:
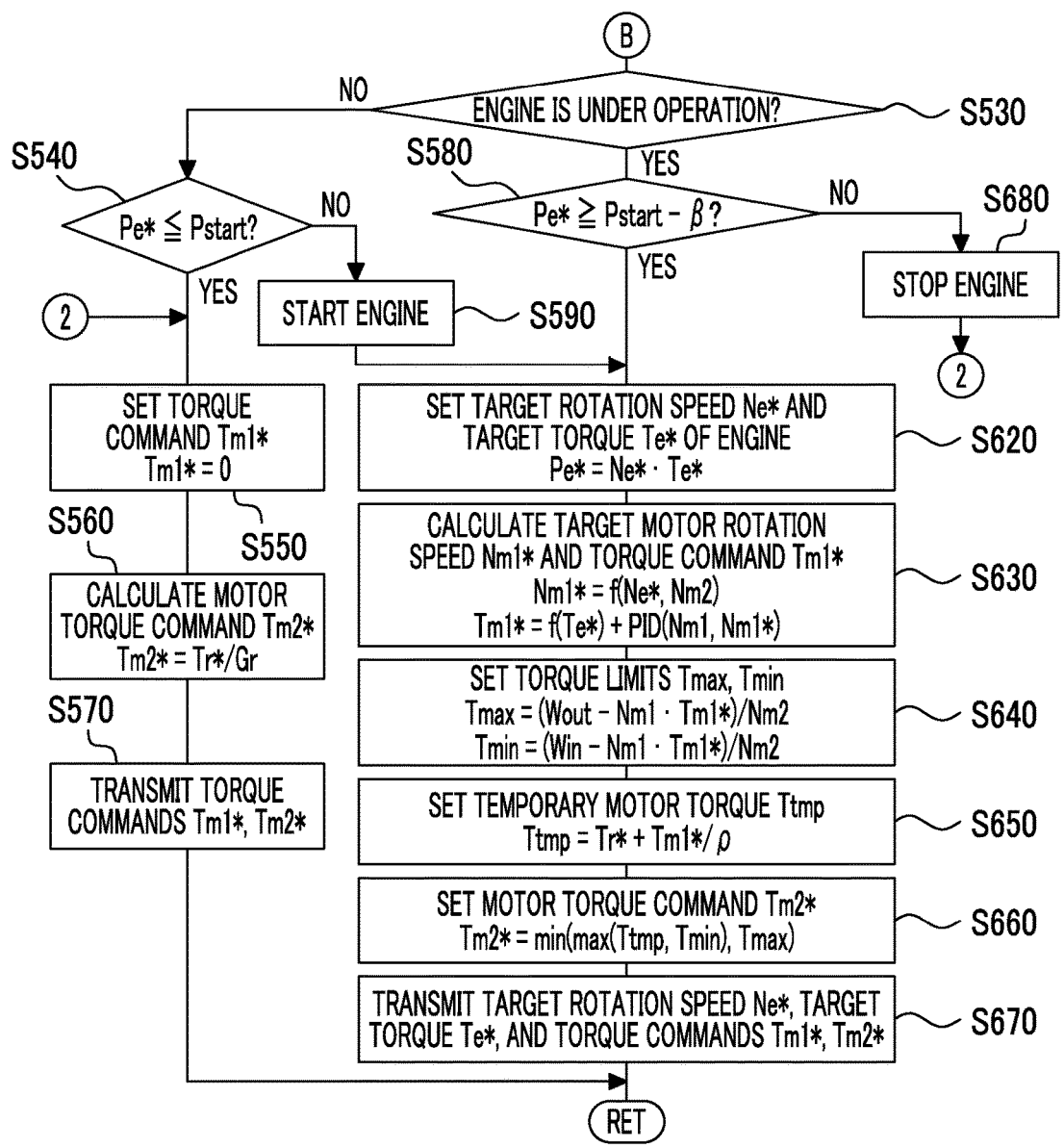
FIG. 5B is a flowchart showing an example of a hybrid traveling priority mode drive control routine.

Next, an operation of the hybrid vehicle 20 of the example during traveling in the electrically powered traveling priority mode or the hybrid traveling priority mode will be described. FIGS. 4A and 4B are flowcharts showing an example of an electrically powered traveling priority mode drive control routine that is executed by the HVECU 70 when the electrically powered traveling priority mode is set. FIGS. 5A and 5B are flowcharts showing an example of a hybrid traveling priority mode drive control routine that is executed by the HVECU 70 when the hybrid traveling priority mode is set. Each of the routines is repeatedly executed at every predetermined time (for example, every several msec) when the corresponding traveling mode is set. First, drive control during traveling in the electrically powered traveling priority mode will be described, and thereafter, drive control during traveling in the hybrid traveling priority mode will be described.

In a case where the electrically powered traveling priority mode drive control routine of FIGS. 4A and 4B is executed, the CPU of the HVECU 70 first executes processing for inputting data for control, such as the accelerator operation amount Acc from the accelerator pedal position sensor 84, the brake pedal position BP from the brake pedal position sensor 86, the vehicle speed V from the vehicle speed sensor 88, the rotation speeds Nm1, Nm2 of the motors MG1, MG2, the state of charge SOC of the battery 50, and the input and output limits Win, Wout of the battery 50 (Step S300). For the rotation speeds Nm1, Nm2 of the motors MG1, MG2, values calculated based on the rotation positions of the rotors of the motors MG1, MG2 detected by the rotation position detection sensors 43, 44 are input from the motor ECU 40 through communication. For the state of charge SOC of the battery 50, a value calculated based on the battery current Ib of the battery 50 is input from the battery ECU 52 through communication. For the input and output limits Win, Wout of the battery 50, values set based on the battery temperature Tb of the battery 50 and the state of charge SOC of the battery 50 are input from the battery ECU 52 through communication.

Figure 6:
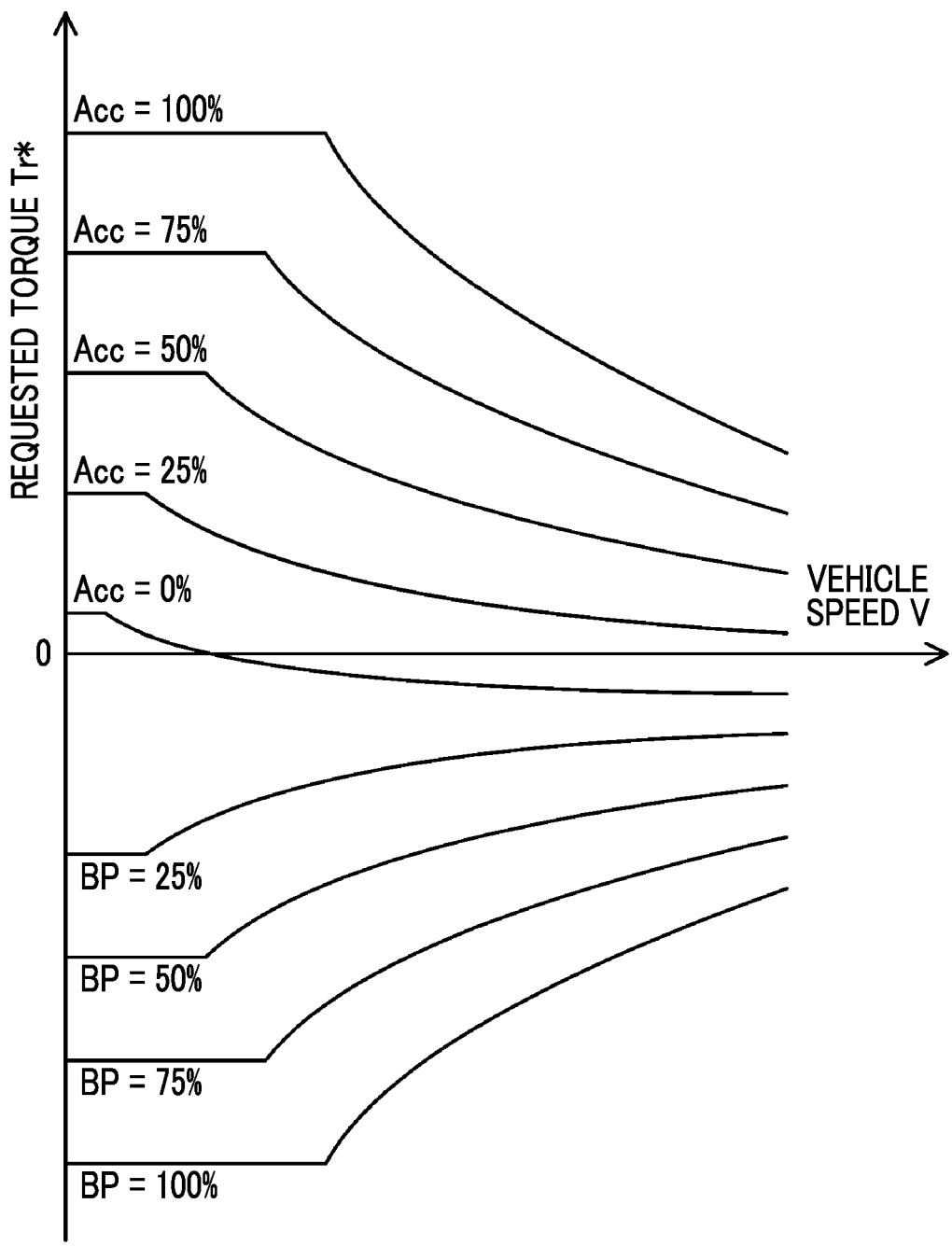
FIG. 6 is an explanatory view showing an example of a map for requested torque setting.

In a case where data is input in this manner, requested torque Tr* to be output to the drive shaft 36 coupled to the drive wheels 39*a*, 39*b* as torque requested for the vehicle and power for traveling Pdrv* requested for the vehicle for traveling are set based on the input accelerator operation amount Acc, brake pedal position BP, and vehicle speed V (Step S310). In the example, the requested torque Tr* is set by determining the relationship of the accelerator operation amount Acc, the brake pedal position BP, the vehicle speed V, and the requested torque Tr* in advance, storing the relationship in the ROM as a map for requested torque setting, and in a case where the accelerator operation amount Acc, the brake pedal position BP, and the vehicle speed V are given, deriving the corresponding requested torque Tr* from the stored map. FIG. 6 shows an example of the map for requested torque setting. In regard to the requested torque Tr*, a positive value indicates drive torque, and a negative value indicates braking torque. The power for traveling Pdrv* can be calculated as the sum of a value obtained by multiplying the set requested torque Tr* by a rotation speed Nr of the drive shaft 36 and loss Loss as loss. The rotation speed Nr of the drive shaft 36 can be obtained based on the vehicle speed V or can be obtained based on a rotation speed Nm of the motor MG2.

Subsequently, a smaller value of the input state of charge SOC and an upper limit value Slim (for example, 80%, 85%, or the like) determined in advance is set as a target state of charge SOC* (Step S312). Then, a value obtained by multiplying the output limit Wout of the battery 50 by a conversion coefficient kw for converting electric power to power of a drive system is set as a threshold Pstart for starting the engine 22 (Step S320).

Figure 7:
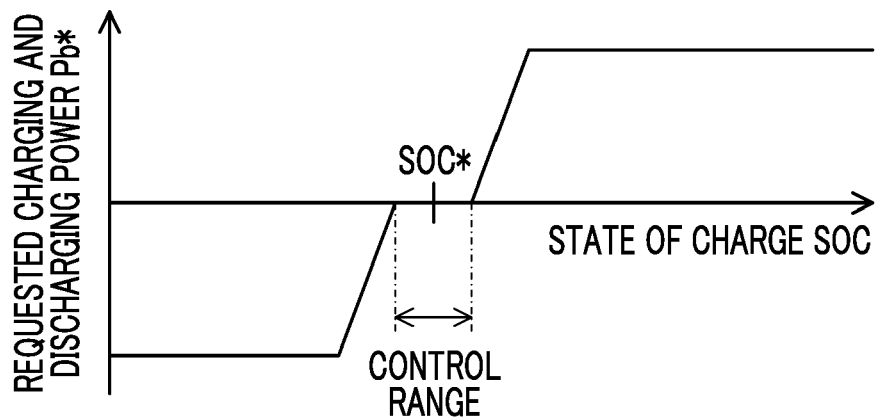
FIG. 7 is an explanatory view showing an example of a map for requested charging and discharging power setting.

Next, requested charging and discharging power Pb* as power for charging and discharging the battery 50 is set based on the set target state of charge SOC* and the input state of charge SOC (Step S322). The requested charging and discharging power Pb* is set using a requested charging and discharging power setting map. FIG. 7 shows an example of the requested charging and discharging power setting map. As shown in the drawing, when the state of charge SOC is larger than a control range (for example, a range of plus/minus 5% or 10% from the target state of charge SOC*, or the like) centering on the target state of charge SOC*, the requested charging and discharging power Pb* is set to power (discharging power) of a positive value where an absolute value thereof tends to become larger so as to cancel the difference between an upper limit value of the control range and the state of charge SOC when the difference becomes larger. When the state of charge SOC is smaller than the control range, the requested charging and discharging power Pb* is set to power (charging power) of a negative value where an absolute value thereof tends to become larger so as to cancel the difference between a lower limit value of the control range and the state of charge SOC when the difference becomes larger. The requested charging and discharging power Pb* is set in this manner, whereby, even if the state of charge SOC is outside the control range centering on the target state of charge SOC*, it is possible to make the state of charge SOC fall within the control range. Setting the requested charging and discharging power Pb* such that the state of charge SOC falls within the control range centering on the target state of charge SOC*, not the target state of charge SOC*, is to suppress frequent charging and discharging. In the electrically powered traveling priority mode, when the state of charge SOC is equal to or less than an upper limit value Slim, since the state of charge SOC is set as the target state of charge SOC* as it is, a value of 0 is set as the requested charging and discharging power Pb*.

In a case where the requested charging and discharging power Pb* is set in this manner, a value obtained by subtracting the requested charging and discharging power Pb* (a negative value for charging) from the power for traveling Pdrv* is set as requested engine power Pe* that is power requested for the engine 22 (Step S324), and determination is made whether the engine 22 is in operation or during an operation stop (Step S330). When the engine 22 is during the operation stop, determination is made whether or not the set power for traveling Pdrv* is equal to or less than a threshold Pstart (Step S340). When the power for traveling Pdrv* is equal to or less than the threshold Pstart, determination is made that the electrically powered traveling can be continued, a value of 0 is set as a torque command Tm1* of the motor MG1 (Step S350), the requested torque Tr* is set as a torque command Tm2* to be output from the motor MG2 (Step S360), the set torque commands Tm1*, Tm2* are transmitted to the motor ECU 40 (Step S370), and this routine ends. The motor ECU 40 that receives the torque commands Tm1*, Tm2* perform switching control of the switching elements (not shown) of the inverters 41, 42 such that torque of the torque commands Tm1*, Tm2* is output from the motors MG1, MG2. Through such control, the requested torque Tr* is output from the motor MG2 to the drive shaft 36 to perform traveling, that is, to perform traveling with the electrically powered traveling. When the requested torque Tr* is less than a value of 0, the torque command Tm2* of the motor MG2 becomes less than the value of 0, the braking torque by the regenerative braking of the motor MG2 is output to the drive shaft 36 to perform deceleration traveling, and the battery 50 is charged with electric power generated by the motor MG2.

Figure 8:
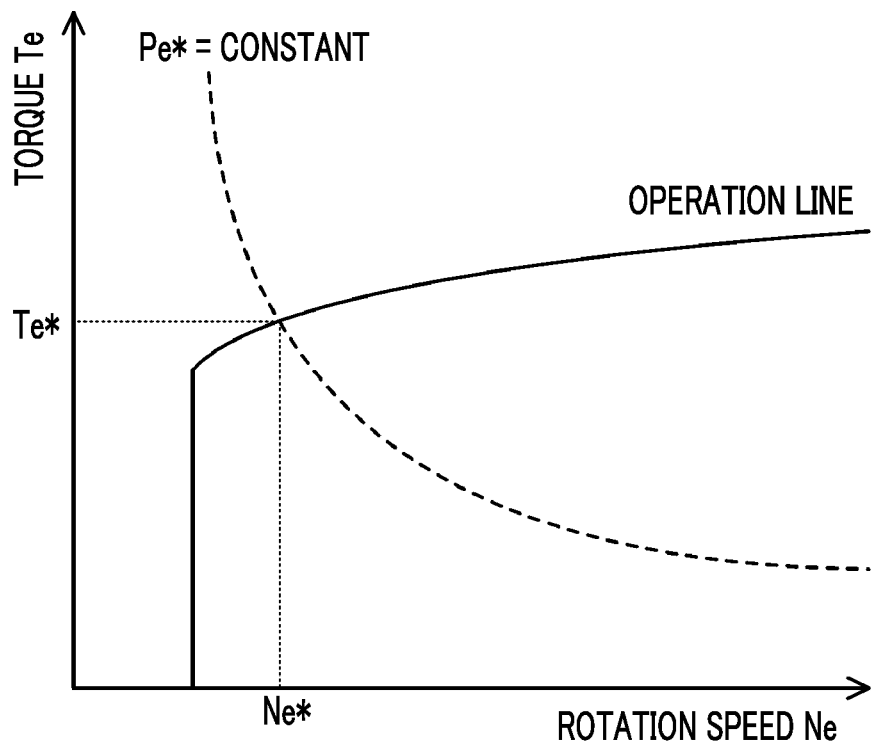
FIG. 8 is an explanatory view showing an example of an operation line of an engine and an example of a manner of setting a target rotation speed and target torque.

In Step S340, in a case where determination is made that the power for traveling Pdrv* is larger than the threshold Pstart, the engine 22 is started (Step S390). In a case where the engine 22 is started, a target rotation speed Ne* and a target torque Te* as an operation point where the engine 22 is to be operated are set based on the set requested engine power Pe* and an operation line for efficiently operating the engine 22 (Step S420). FIG. 8 shows an example of the operation line of the engine 22 and a manner of setting the target rotation speed Ne* and the target torque Te*. As shown in the drawing, the target rotation speed Ne* and the target torque Te* can be obtained by an intersection of the operation line and a curve where the requested power Pe* (Ne*×Te*) is constant.

Next, a target rotation speed Nm1* of the motor MG1 is calculated using the target rotation speed Ne* of the engine 22, the rotation speed Nm2 of the motor MG2, and a gear ratio ((the number of teeth of the sun gear)/(the number of teeth of the ring gear)) ρ of the planetary gear 30 by Expression (1), and the torque command Tm1* to be output from the motor MG1 is calculated based on the calculated target rotation speed Nm1* and input rotation speed Nm1 of the motor MG1 by Expression (2) (Step S430). Expression (1) is a dynamic relational expression to the rotating elements of the planetary gear 30. Expression (2) is a relational expression in feedback control for rotating the motor MG1 at the target rotation speed Nm1*, and in Expression (2), "k1" in a second term on a right side is a gain of a proportional term, and "k2" in a third term on the right side is a gain of an integral term.

$$Nm1^* = Ne^* \cdot (1+\rho)/\rho - Nm2/\rho \quad (1)$$

$$Tm1^* = \rho \le Te^*/(1+\rho) + k1(Nm1^* - Nm1) + k2\int(Nm1^* - Nm1)dt \quad (2)$$

In a case where the torque command Tm1* of the motor MG1 is set, temporary motor torque Ttmp that is a temporary value of torque to be output from the motor MG2 is calculated by adding a value obtained by dividing the torque command Tm1* by the gear ratio ρ of the planetary gear 30 to the set requested torque Tr* by Expression (3) (Step S440). Next, the differences between the input and output limits Win, Wout of the battery 50 and electric power consumption (generated electric power) of the motor MG1 by multiplying the set torque command Tm1* by the current rotation speed Nm1 of the motor MG1 are divided by the rotation speed Nm2 of the motor MG2. With this, torque limits Tmax, Tmin as upper and lower limits of torque that may be output from the motor MG2 are calculated by Expressions (4) and (5) (Step S450). Then, the set temporary motor torque Ttmp is limited to the torque limits Tmax, Tmin by Expression (6) to set the torque command Tm2* of the motor MG2 (Step S460), the target rotation speed Ne* and the target torque Te* of the engine 22 are transmitted to the engine ECU 24, and the torque commands Tm1*, Tm2* of the motors MG1, MG2 are transmitted to the motor ECU 40 (Step S470), and the routine ends. The engine ECU 24 that receives the target rotation speed Ne* and the target torque Te* performs fuel injection control, ignition control, and intake air amount adjustment control, and the like of the engine 22 such that the engine 22 is operated at an operation point (target operation point) defined by the target rotation speed Ne* and the target torque Te*. The motor ECU 40 that receives the torque commands Tm1*, Tm2* performs the switching control of the switching elements (not shown) of the inverters 41, 42 such that torque of the torque commands Tm1*, Tm2* is output from the motors MG1, MG2. With this, traveling is enabled with the hybrid traveling where the power for traveling Pdrv* (requested torque Tr*) is output to the drive shaft 36 while the requested engine power Pe* is output from the engine 22. In a case where the engine 22 is operated at the operation point defined by the target rotation speed Ne* and the target torque Te* in a state in which the requested charging and discharging power Pb* is the value of 0 is considered. In this case, the power for traveling Pdrv* defined by the target rotation speed Ne* and the target torque Te* is output from the engine 22, and is converted to power defined by the rotation speed Nr and the requested torque Tr* of the drive shaft 36 by the planetary gear 30 and the two motors MG1, MG2 to enable traveling.

$$Ttmp = Tr^* + Tm1^*/\rho \quad (3)$$

$$Tmax = (Wout - Tm1^* \cdot Nm1)/Nm2 \quad (4)$$

$$Tmin = (Win - Tm1^* \cdot Nm1)/Nm2 \quad (5)$$

$$Tm2^* = \min(\max(Ttmp, Tmin), Tmax) \quad (6)$$

If traveling is started using power from the engine 22 in this manner, when the next routine is executed, in Step S330, since determination is made that the engine 22 is in operation, the power for traveling Pdrv* is compared with a value obtained by subtracting predetermined power α as a margin from the threshold Pstart (Step S380). The predetermined power α provides hysteresis to prevent frequent starts and stops of the engine 22 when the power for traveling Pdrv* is close to the threshold Pstart, and can be suitably set. When the power for traveling Pdrv* is equal to or larger than the value obtained by subtracting the predetermined power α from the threshold Pstart, determination is made that the operation of the engine 22 is to be continued, the processing of Steps S410 to S470 described above is executed to enable the hybrid traveling, and the routine ends.

In Step S380, when determination is made that the power for traveling Pdrv* is less than the value obtained by subtracting the predetermined power α from the threshold Pstart, the operation of the engine 22 is stopped (Step S480), the processing of Steps S350 to S370 described above is executed to enable the electrically powered traveling, and the routine ends.

Next, an operation when the hybrid traveling priority mode is set as the traveling mode will be described based on the hybrid traveling priority mode drive control routine of FIGS. 5A and 5B. In a case where the hybrid traveling priority mode drive control routine is executed, the CPU of the HVECU 70 first inputs data, such as the accelerator operation amount Acc, the brake pedal position BP, the vehicle speed V, the rotation speeds Nm1, Nm2 of the motors MG1, MG2, the state of charge SOC of the battery 50, and the input and output limits Win, Wout (Step S500), and sets the requested torque Tr* and the power for traveling Pdrv* (Step S510). The processing of Steps S500 and S510 is the same as the processing of Steps S300 and S310 of FIG. 4A.

Then, the target state of charge SOC* of the battery 50 is set (Step S512). Setting of the target state of charge SOC* in the hybrid traveling priority mode is performed by a target state of charge setting routine illustrated in FIG. 9. In the target state of charge setting routine, first, determination is made whether or not the deterioration flag Fdet is the value of 1 (Step S700). In a case where determination is made that the deterioration flag Fdet is the value of 0, determination is made that the degree of high rate deterioration is less than the predetermined degree, the target state of charge SOC* is set to a predetermined state of charge Sset determined in advance (Step S710), and the target state of charge setting routine ends. In the example, the predetermined state of charge Sset is determined as the first state of charge Sref1 (for example, 10%, 15%, or the like) that is the traveling mode switching threshold Sref for switching the electrically powered traveling priority mode and the hybrid traveling priority mode at the time of non-high rate deterioration, or a value near the first state of charge Sref1. For this reason, in the hybrid traveling priority mode, there is a case where charging and discharging of the battery 50 are repeated with a comparatively low state of charge SOC, and high rate deterioration is likely to occur.

Figure 10:
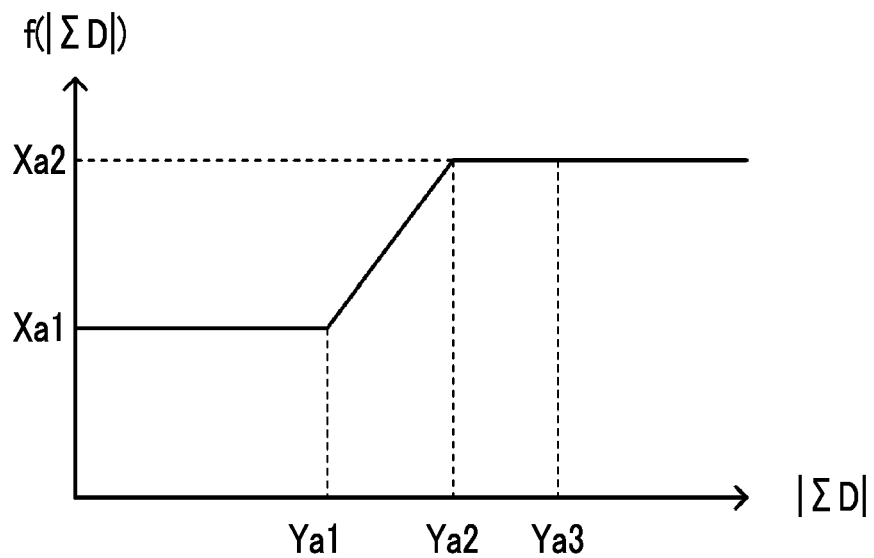
FIG. 10 is an explanatory view showing an example of a map for basic increase amount setting.
Figure 11:
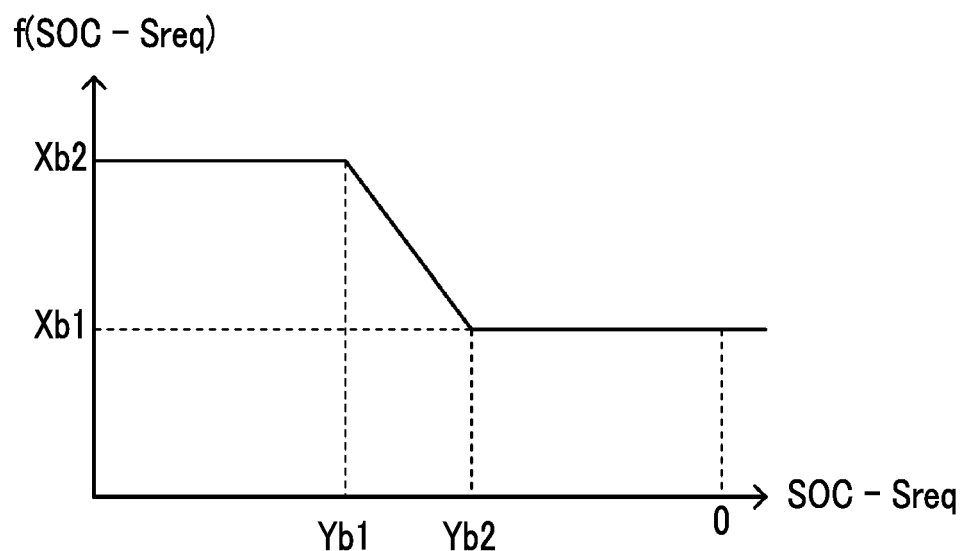
FIG. 11 is an explanatory view showing an example of a map for correction amount setting.

In a case where determination is made that the deterioration flag Fdet is the value of 1, determination is made that the degree of high rate deterioration is equal to or larger than the predetermined degree, and first, determination is made whether or not the requested torque Tr* is equal to or larger than the value of 0, that is, the requested torque Tr* is the drive torque (the motor MG2 is not during the regenerative braking) (Step S720). When the requested torque Tr* is equal to or larger than the value of 0, the state of charge SOC of the battery 50 is input (Step S730), and an increase amount X of the target state of charge is set according to the sum of a basic increase amount f(|ΣD|) based on the absolute value of the evaluation value ΣD and a correction amount f(SOC−Sreq) based on the difference (SOC−Sreq) between the input state of charge SOC and the requested deterioration recovery state of charge Sreq determined in advance (Step S740). The requested deterioration recovery state of charge Sreq is a state of charge requested for recovering high rate deterioration, and is determined to, for example, 50%, 60%, or the like. The basic increase amount f(|ΣD|) can be set, for example, by obtaining the relationship of the absolute value of the evaluation value ΣD and the basic increase amount f(|ΣD|) in advance, storing the relationship in the ROM as a map for basic increase amount setting, and deriving the corresponding basic increase amount f(|ΣD|) from the map when the evaluation value ΣD is given. FIG. 10 shows an example of the map for basic increase amount setting. The basic increase amount f(|ΣD|) is set to be a larger value when the degree of high rate deterioration is larger. Specifically, as shown in FIG. 10, the basic increase amount f(|ΣD|) is set to a comparatively small value Xa1 when the absolute value of the evaluation value ΣD indicating the degree of high rate deterioration is equal to or less than a comparatively small value Ya1, and in a case where the absolute value of the evaluation value ΣD exceeds the value Ya1, is set to be larger when the absolute value of the evaluation value ΣD is larger. In the example, in a case where the absolute value of the evaluation value ΣD exceeds a value Ya2 larger than the value Ya1, the basic increase amount f(|ΣD|) is fixed to a value Xa2 larger than the value Xa1. When the absolute value of the evaluation value ΣD exceeds a value Ya3 larger than the value Ya2, in a case where the evaluation value ΣD is a positive value (over-discharging), the output limit Wout of the battery 50 is corrected such that discharging of the battery 50 is limited, and in a case where the evaluation value ΣD is a negative value (over-charging), the input limit Win of the battery 50 is corrected such that charging of the battery 50 is limited. The correction amount f(SOC−Sreq) can be set, for example, by obtaining the relationship of the difference (SOC−Sreq) between the state of charge SOC and the requested deterioration recovery state of charge Sreq and the correction amount f(SOC−Sreq) in advance, storing the relationship in the ROM as a map for correction amount setting, and deriving the corresponding correction amount f(SOC−Sreq) from the map when the difference (SOC−Sreq) is given. FIG. 11 shows an example of the map for correction amount setting. The correction amount f(SOC−Sreq) is set to be a smaller value when the difference (SOC−Sreq) is closer to the value of 0, that is, when the state of charge SOC is closer to the requested deterioration recovery state of charge Sreq. Specifically, as shown in FIG. 11, the correction amount f(SOC−Sreq) is set to a comparatively large value Xb2 when the difference (SOC−Sreq) is a comparatively small negative value Yb1, and in a case where the difference (SOC−Sreq) exceeds the value Yb1, is set to be smaller when the difference (SOC−Sreq) is larger. In the example, in a case where the difference (SOC−Sreq) exceeds a value Yb2 larger than the value Yb1 and smaller than the value of 0, the correction amount f(SOC−Sreq) is fixed to a value Xb1 smaller than the value Xb2. A range in which the difference (SOC−Sreq) is equal to or larger than the value Yb1 is a range in which the progress of high rate deterioration is weakened.

In a case where the increase amount X of the state of charge is set in this manner, a larger value out of the target state of charge (previous SOC*) set in the previous routine and a value (SOC+X) obtained by adding the set increase amount X to the input state of charge SOC is obtained and a smaller value out of the obtained value and the requested deterioration recovery state of charge Sreq is set as the target state of charge SOC* (Step S780), and the target state of charge setting routine ends.

Figure 12:
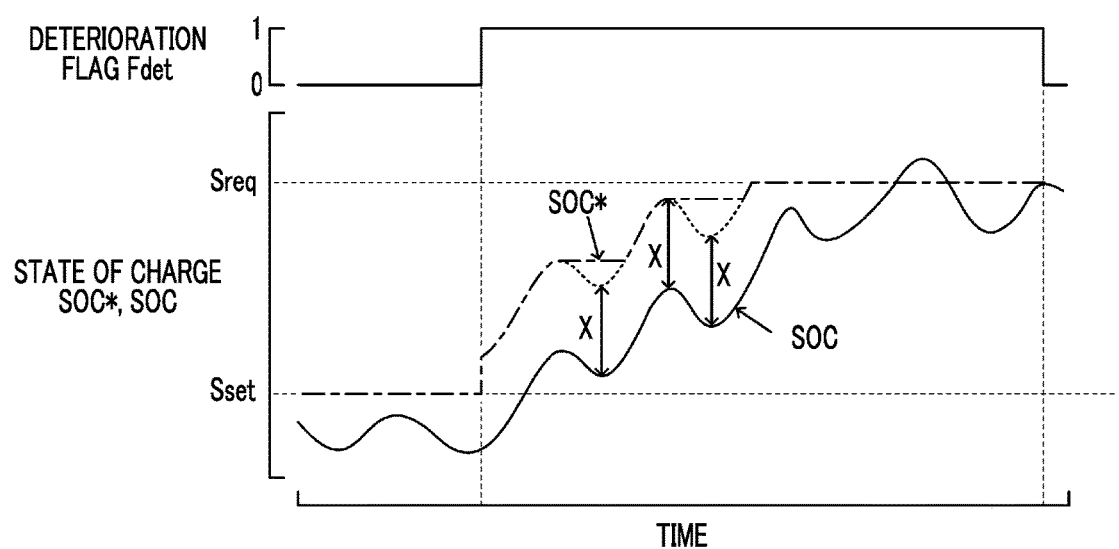
FIG. 12 is an explanatory view showing a manner of temporal change in a state of charge and a target state of charge when high rate deterioration occurs in a battery.

FIG. 12 is an explanatory view showing a manner of temporal change in current state of charge SOC and target state of charge SOC* when high rate deterioration occurs in the battery 50. As shown in the drawing, in a case where high rate deterioration occurs, the target state of charge SOC* is set to a value obtained by adding the increase amount X to the state of charge SOC when the state of charge SOC increases within a range not exceeding the requested deterioration recovery state of charge Sreq, and is maintained to the target state of charge (previous SOC*) previously set when the state of charge SOC decreases. That is, in a case where high rate deterioration occurs, the target state of charge SOC* is set so as to gradually increase by monotonically increasing toward the requested deterioration recovery state of charge Sreq.

In this way, at the time of high rate deterioration, the target state of charge SOC* is set so as to monotonically increase within a range not exceeding the requested deterioration recovery state of charge Sreq. At the time of high rate deterioration, the second state of charge Sref2 is set as the traveling mode switching threshold Sref for switching the electrically powered traveling priority mode and the hybrid traveling priority mode. The second state of charge Sref2 is determined to a value equal to or larger than the requested deterioration recovery state of charge Sreq. For this reason, basically, in Step S140 of the traveling mode setting routine of FIG. 2, determination is not made that the state of charge SOC of the battery 50 is equal to or larger than the value obtained by adding the predetermined ratio α to the traveling mode switching threshold Sref, and the electrically powered traveling priority mode is not set. With this, at the time of high rate deterioration, the frequency of traveling with the electrically powered traveling decreases, and a decrease in the state of charge SOC due to discharging of the battery 50 is suppressed.

In Step S720, when the requested torque Tr* is less than the value of 0, that is, when the requested torque Tr* is the braking torque (the motor MG2 is during the regenerative braking), determination is made whether or not the requested torque (previous Tr*) set in the previous hybrid traveling priority mode drive control routine is equal to or larger than the value of 0 (Step S750). The determination is to determine whether or not the requested torque Tr* is switched from the drive torque to the braking torque, that is, a start of the regenerative braking by the motor MG2. In a case where determination is made that the requested torque Tr* is less than the value of 0 and the previous Tr* is equal to or larger than the value of 0, a value obtained by subtracting the input state of charge SOC from the target state of charge (previous SOC*) set in the previous target state of charge setting routine is set as the increase amount X (Step S760). Then, a larger value out of the previous SOC* and the value obtained by adding the increase amount X to the input state of charge SOC is obtained and a smaller value out of the obtained value and the requested deterioration recovery state of charge Sreq is set as the target state of charge SOC* (Step S780), and the target state of charge setting routine ends. The value obtained by adding the increase amount X to the state of charge SOC becomes the previous SOC* since the increase amount X is calculated as the value obtained by subtracting the state of charge SOC from the previous SOC*. For this reason, the target state of charge SOC* becomes a smaller value out of the previous SOC* and the requested deterioration recovery state of charge Sreq. Since the target state of charge SOC* is set within a range equal to or less than the requested deterioration recovery state of charge Sreq, the previous SOC* is set as the target state of charge SOC* as it is. In this way, immediately after the requested torque Tr* is switched from the drive torque to the braking torque, the target state of charge SOC* is not changed.

In Step S750, in a case where determination is made that the previous Tr* is equal to or larger than the value of 0, determination is made that the regenerative braking of the motor MG2 is already started, and the increase amount (previous X) set in the previous target state of charge setting routine is set as the increase amount X as it is (Step S770). Then, a larger value out of the previous SOC* and a value obtained by adding the increase amount X to the input state of charge SOC is obtained and a smaller value out of the obtained value and the requested deterioration recovery state of charge Sreq is set as the target state of charge SOC* (Step S780), and the target state of charge setting routine ends. When the motor MG2 is during the regenerative braking, the battery 50 is charged with electric power generated by the motor MG2, and the state of charge SOC of the battery 50 increases. For this reason, since the value obtained by adding the increase amount X to the input state of charge SOC is larger than the previous SOC*, the target state of charge SOC* is set so as to increase with a given increase amount X to the state of charge SOC until the regenerative braking is released after the regenerative braking of the motor MG2 is started. As above, the target state of charge setting routine of FIG. 9 has been described.

Returning to the hybrid traveling priority mode drive control routine of FIGS. 5A and 5B, in a case where the target state of charge SOC* is set in this manner, the threshold Pstart for starting the engine 22 is set based on the difference (SOC−SOC*) between the input state of charge SOC and the set target state of charge SOC* (Step S520). The threshold Pstart is set based on the difference (SOC−SOC*) using a map for threshold setting. The map for threshold setting is defined such that the threshold Pstart becomes larger when the difference (SOC−SOC*) is larger. Subsequently, the requested charging and discharging power Pb* is set (Step S522), and power obtained by subtracting the requested charging and discharging power Pb* (a negative value for charging) from the power for traveling Pdrv* is set as the requested engine power Pe* (Step S524). Setting of the requested charging and discharging power Pb* is performed by a requested charging and discharging power setting routine of FIG. 13. Setting of the requested engine power Pe* is the same as Step S324 of the electrically powered traveling priority mode drive control routine of FIG. 4A.

Figure 13:
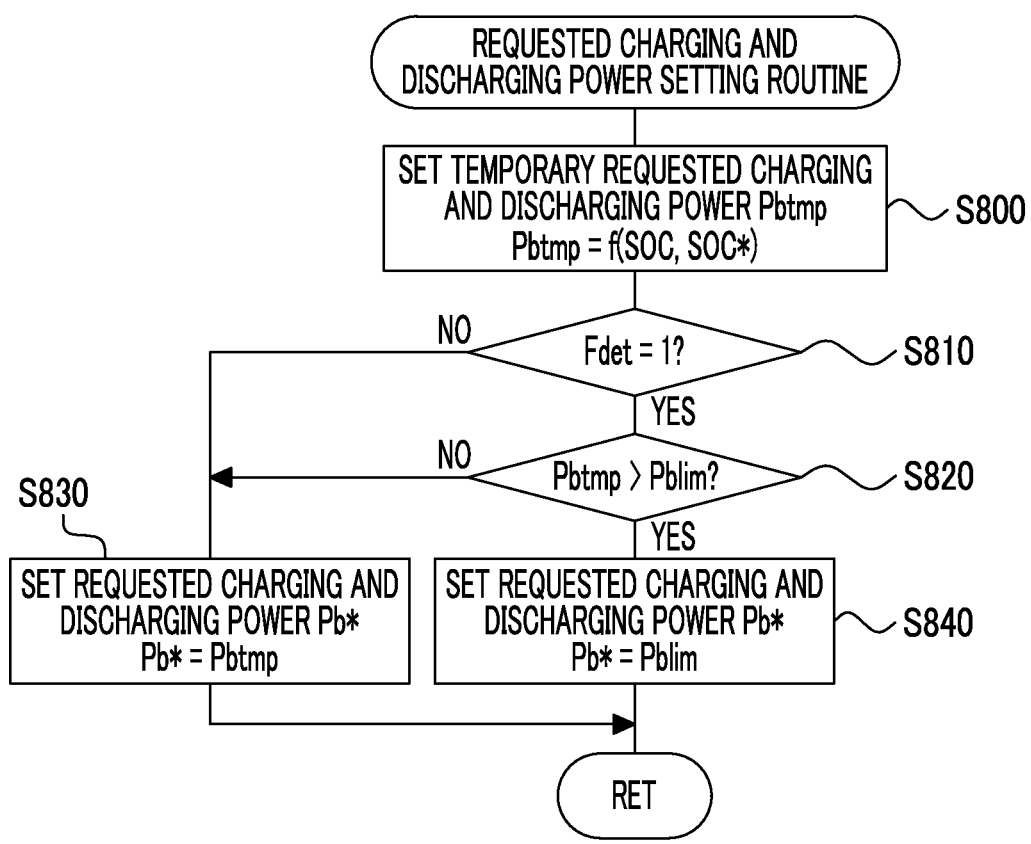
FIG. 13 is a flowchart showing an example of a requested charging and discharging power setting routine.

In the requested charging and discharging power setting routine of FIG. 13, temporary requested charging and discharging power Pbtmp (a negative value for charging) that is a temporary value of the requested charging and discharging power Pb* is set based on the target state of charge SOC* and the state of charge SOC through the same processing as Step S322 (Step S800). Subsequently, determination is made whether or not the deterioration flag Fdet is the value of 1 (Step S810), and whether or not the temporary requested charging and discharging power Pbtmp is larger than negative lower limit power Pblim that is a lower limit value of charging power (Step S820). When the deterioration flag Fdet is not the value of 1 or even if the deterioration flag Fdet is the value of 1, when the temporary requested charging and discharging power Pbtmp is equal to or less than the negative lower limit power Pblim, the temporary requested charging and discharging power Pbtmp is set as the requested charging and discharging power Pb* (Step S830), and the requested charging and discharging power setting routine ends. When the deterioration flag Fdet is the value of 1 and the temporary requested charging and discharging power Pbtmp is larger than the negative lower limit power Pblim, the lower limit power Pblim is set as the requested charging and discharging power Pb* (Step S840), and the requested charging and discharging power setting routine ends. In this way, when the degree of high rate deterioration is equal to or larger than the predetermined degree, lower limit guard processing for setting a smaller value (in a case of absolute values, a larger value) out of the temporary requested charging and discharging power Pbtmp set based on the target state of charge SOC* and the state of charge SOC and the lower limit power Pblim as the requested charging and discharging power Pb* is performed. With this, in a case of traveling with the hybrid traveling, it is possible to charge the battery 50 with sufficient electric power, and to promptly increase the state of charge SOC to recover high rate deterioration.

As described above, the target state of charge SOC* at the time of high rate deterioration increases comparatively rapidly since the increase amount X is large when the degree of high rate deterioration (the absolute value of the evaluation value ΣD) is large, and increases comparatively gradually since the increase amount X is small when the degree of high rate deterioration is small or when the state of charge SOC is close to the requested deterioration recovery state of charge Sreq. A case where the target state of charge SOC* rapidly increases is now considered. In this case, the threshold Pstart becomes a small value from the difference (SOC−SOC*) between the state of charge SOC and the target state of charge SOC* becomes small, and the requested engine power Pe* becomes a large value since the requested charging and discharging power Pb* becomes large for charging (the value become small because of a negative value for charging). In this case, since the electrically powered traveling is hardly performed (the engine 22 is hardly stopped) for the charging and discharging control (charging control) of the battery 50, fuel efficiency is deteriorated or the driver feels a sense of discomfort since the electrically powered traveling is hardly performed. In the example, when the degree of high rate deterioration is small or when the state of charge SOC is close to the requested deterioration recovery state of charge Sreq, an increase in the target state of charge SOC* is performed gradually, whereby it is possible to reduce a sense of discomfort given to the driver due to the charging and discharging of the battery 50. The reason that an increase in the target state of charge SOC* is performed gradually when the state of charge SOC is close to the requested deterioration recovery state of charge SOC is because it is considered that high rate deterioration is recovered to a certain extent with an increase in the state of charge SOC until now.

Next, determination is made whether the engine 22 is in operation or during an operation stop (Step S530), when the engine 22 is during the operation stop, determination is made whether or not the set requested engine power Pe* is equal to or less than the threshold Pstart (Step S540), when the requested engine power Pe* is equal to or less than the threshold Pstart, determination is made that the electrically powered traveling can be continued, the torque command Tm1* of the motor MG1 is set to the value of 0 (Step S550), the requested torque Tr* is set as the torque command Tm2* to be output from the motor MG2 (Step S560), the set torque commands Tm1*, Tm2* are transmitted to the motor ECU 40 (Step S570), and the routine ends. The processing of Steps S550 to S570 is the same as the processing of Steps S350 to S370 of the electrically powered traveling priority mode drive control routine of FIG. 4B. When the requested torque Tr* is less than the value of 0, the torque command Tm2* of the motor MG2 also becomes less than the value of 0, and as in the electrically powered traveling priority mode drive control routine, the braking torque by the regenerative braking of the motor MG2 is output to the drive shaft 36 to enable deceleration traveling and the battery 50 is charged with electric power generated by the motor MG2. As described above, the target state of charge SOC* is not changed when the regenerative braking of the motor MG2 is started, and subsequently, increases with a given increase amount X to the state of charge SOC until a request for the regenerative braking is released. With this, it is possible to charge the battery 50 with sufficient electric power, and to quickly increase the state of charge SOC to recover high rate deterioration. Since the target state of charge SOC* is not changed before and after the regenerative braking of the motor MG2, rapid change in the threshold Pstart set based on the state of charge SOC and the target state of charge SOC* or the requested charging and discharging power Pb* is suppressed, thereby reducing a sense of discomfort given to the driver due to the charging and discharging control of the battery 50.

In Step S540, in a case where determination is made that the requested engine power Pe* is larger than the threshold Pstart, the engine 22 is started (Step S590). In a case where the engine 22 is started, in order to enable traveling with the hybrid traveling, processing (Steps S620 to S670) for setting the target rotation speed Ne* and the target torque Te* of the engine 22 and the torque commands Tm1*, Tm2* of the motors MG1, MG2 and transmitting the target rotation speed Ne* and the target torque Te* of the engine 22 and the torque commands Tm1*, Tm2* of the motors MG1, MG2 to the engine ECU 24 or the motor ECU 40 is executed such that the requested engine power Pe* is output and power defined by the rotation speed Nr and the requested torque Tr* is output to the drive shaft 36 by the planetary gear 30 and the two motors MG1, MG2 to enable traveling, and the routine ends. The processing of Steps S620 to S670 is the same as the processing of Steps S420 to S470 of the electrically powered traveling priority mode drive control routine of FIG. 4B after the requested engine power Pe* is set.

In a case where traveling is started using power from the engine 22, when the next routine is executed, since determination is made in Step S530 that the engine 22 is in operation, the requested engine power Pe* is compared with a value obtained by subtracting predetermined power β as a margin from the threshold Pstart (Step S580). The predetermined power β provides hysteresis to prevent frequent starts and stops of the engine 22 when the requested engine power Pe* is close to the threshold Pstart, and can be suitably set, and the same value as the above-described predetermined power α may be used. When the requested engine power Pe* is equal to or larger than the value obtained by subtracting the predetermined power β from the threshold Pstart, determination is made that the operation of the engine 22 is to be continued, and the processing of Steps 620 to S670 described above is executed to enable hybrid traveling, and the routine ends.

In Step S580, when determination is made that the requested engine power Pe* is less than the value obtained by subtracting the predetermined power from the threshold Pstart, the operation of the engine 22 is stopped (Step S680), the processing of Steps S550 to S570 described above is executed to enable the electrically powered traveling, and the routine ends.

In the hybrid vehicle 20 of the example described above, in a case where deterioration (high rate deterioration) occurs in the battery 50 due to unevenness in salt concentration, a larger value out of the previous target state of charge (previous SOC*) and a value obtained by adding the increase amount X, which becomes larger when the degree of deterioration (|ΣD|) is large than when the degree of deterioration (|ΣD|) is small, to the current state of charge SOC is set as the target state of charge SOC* within a range equal to or less than requested deterioration recovery state of charge Sreq requested for deterioration recovery. It has been recognized that the effect of recovering high rate deterioration is high when the state of charge is increased, instead of limiting the charging and discharging electric power. With this, it is possible to quickly recover high rate deterioration. When the degree of high rate deterioration is small, since the target state of charge SOC* is increased gradually, it is possible to reduce a sense of discomfort given to the driver due to the charging and discharging control of the battery 50. When the degree of high rate deterioration is large, since the target state of charge SOC* is increased largely, it is possible to enhance the effect of recovering deterioration. As a result, it is possible to more appropriately recover deterioration of an electric power storage device due to unevenness in salt concentration.

In the hybrid vehicle 20 of the example, the target state of charge SOC* is increased more gradually when the state of charge SOC is close to the requested deterioration recovery state of charge Sreq than when the state of charge SOC is far from the requested deterioration recovery state of charge Sreq. With this, rapid increase in the target state of charge SOC* is suppressed, thereby further reducing a sense of discomfort given to the driver due to the charging and discharging control of the battery 50.

In the hybrid vehicle 20 of the example, in a case where the braking torque is set as the requested torque Tr* and the regenerative braking of the motor MG2 is requested, until the request for the regenerative braking is released, the target state of charge SOC* is set so as to monotonically increase with a given increase amount X to the state of charge SOC from the target state of charge (previous SOC*) set immediately before the start of the regenerative braking. With this, it is possible to charge the battery 50 with sufficient electric power through the regenerative braking of the motor MG2, and to promptly increase the state of charge SOC to quickly recover high rate deterioration. Rapid change in the target state of charge SOC* before and after the start of the regenerative braking of the motor MG2 is suppressed, thereby reducing a sense of discomfort given to the driver due to the charging and discharging control of the battery 50.

In the example, in the deterioration determination routine of FIG. 3, determination is made whether or not the absolute value of the evaluation value ΣD is larger than the threshold value K, thereby determining high rate deterioration caused by over-discharging of the battery 50 and high rate deterioration caused by over-charging of the battery 50. However, high rate deterioration caused by over-discharging may be determined exclusively, or high rate deterioration caused by over-charging may be determined exclusively. In the former case, determination may be made whether or not the evaluation value ΣD is larger than a positive threshold, and in the latter case, determination may be made whether or not the evaluation value ΣD is smaller than a negative threshold.

Figure 9:
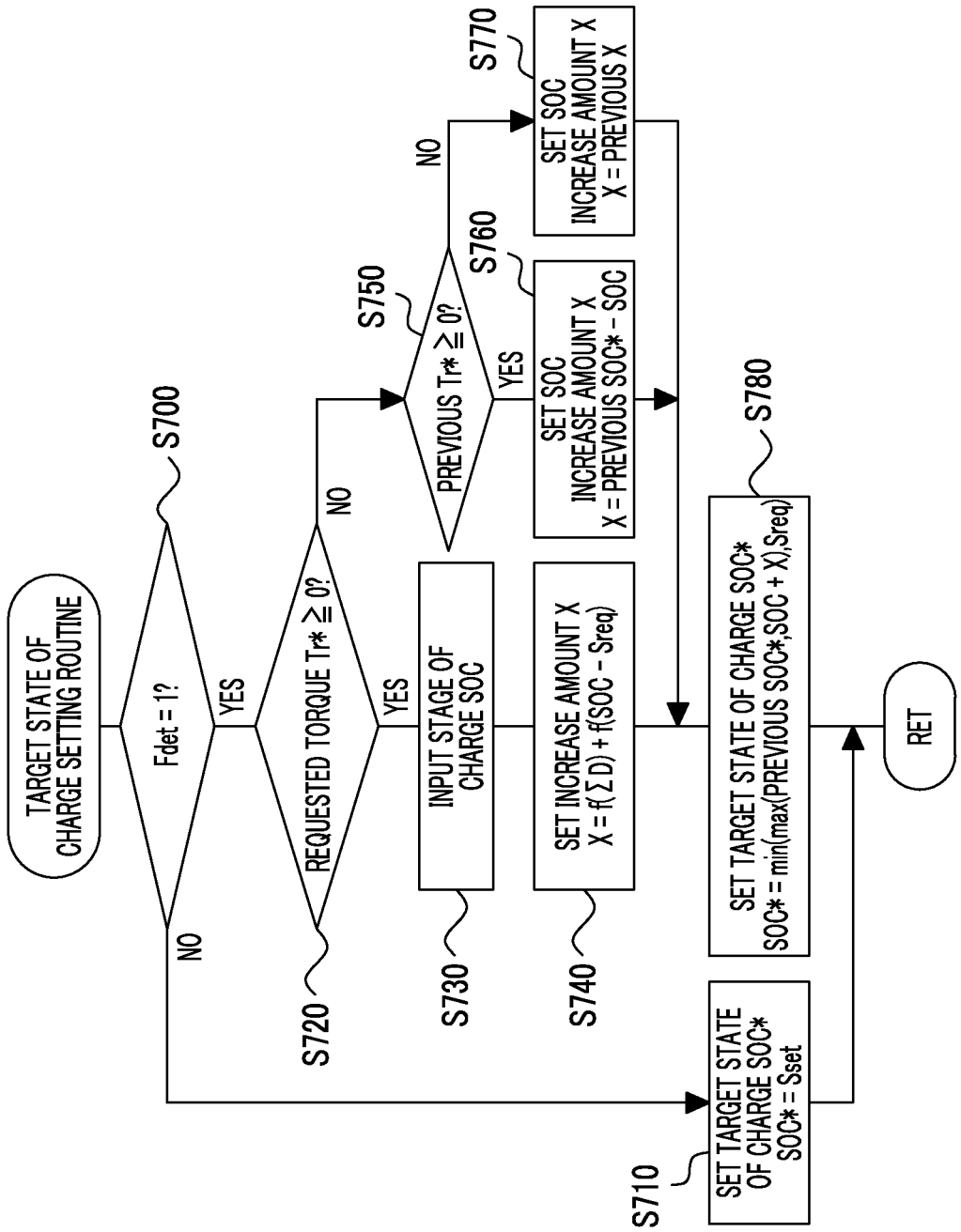
FIG. 9 is a flowchart showing an example of a target state of charge setting routine.

In the example, in the target state of charge setting routine of FIG. 9, basically, a larger value out of the previous target state of charge (previous SOC*) of the battery 50 and the value obtained by adding the increase amount X to the state of charge SOC is set as the target state of charge SOC*. However, a charging rate (increase rate) of the battery 50 may be set, and the target state of charge SOC* may be set so as to monotonically increase according to the set charging rate. In this case, for example, the charging rate may be set to be larger when the degree of high rate deterioration is larger, the target state of charge SOC* of the battery 50 may be set according to the charging rate, and in a case where the difference (SOC*−SOC) between the target state of charge SOC* and the state of charge SOC becomes equal to or larger than a predetermined value, the target state of charge SOO* may be maintained to the previous target state of charge (previous SOC*) regardless of the charging rate. In this case, the charging rate (increase rate) may be set to be smaller when the state of charge SOC is close to the requested state of charge Sreq than when the state of charge SOC is far from the requested state of charge Sreq.

In the example, in the target state of charge setting routine of FIG. 9, the increase amount X of the target state of charge may be set according to the sum of the basic increase amount f(|ΣD|) based on the absolute value (degree of high rate deterioration) of the evaluation value ΣD and the correction amount f(SOC−Sreq) based on the difference (SOC−Sreq) between the state of charge SOC and the requested deterioration recovery state of charge Sreq. However, the increase amount X of the target state of charge may be set by multiplying the basic increase amount based on the absolute value of the evaluation value ΣD by a correction coefficient based on the difference (SOC−Sreq). Although the increase amount X of the target state of charge is set based on the absolute value (degree of high rate deterioration) of the evaluation value ΣD and the difference (SOC−Sreq) between the state of charge SOC and the requested deterioration recovery state of charge Sreq, the increase amount X may be set based on the absolute value (degree of high rate deterioration) of the evaluation value ΣD exclusively, or the increase amount X may be set in consideration of other parameters.

In the example, in the target state of charge setting routine of FIG. 9, determination is made whether or not the motor MG2 is during the regenerative braking based on the positive and negative of the requested torque Tr*. However, determination may be made whether or not the motor MG2 is during the regenerative braking based on the on and off of the accelerator pedal 83 or the on and off of the brake pedal 85.

In the example, in the requested charging and discharging power setting routine of FIG. 13, when the degree of high rate deterioration is equal to or larger than the predetermined degree, the lower limit guard processing for setting a smaller value (in a case of absolute values, a larger value) out of the temporary requested charging and discharging power Pbtmp set based on the target state of charge SOC* and the state of charge SOC and the lower limit power Pblim as the requested charging and discharging power Pb* is performed. However, such lower limit guard processing may not be performed.

In the example, although the charger 90 that is chargeable the battery 50 with electric power from the external power supply 100 is provided, the charger 90 may not be provided.

In the example, although a configuration is made in which a hybrid vehicle includes the engine 22, the planetary gear 30, the motors MG1, MG2, and the battery 50, an applicable embodiment of the present disclosure is not limited thereto, a so-called series type hybrid vehicle including an engine, a power generator connected to an output shaft of the engine, an electric motor configured to output power to a drive shaft and to perform electric power generation, and an electric power storage device configured to exchange electric power with the power generator and the electric motor may be provided. Alternatively, a hybrid vehicle including an engine connected to a drive shaft through a transmission, an electric motor configured to output power to the drive shaft and to perform electric power generation, and an electric power storage device configured to exchange electric power with the electric motor may be applied. Alternatively, a vehicle including an electric motor configured to output power to a drive shaft and to perform electric power generator, an electric power storage device configured to exchange electric power with the electric motor, and a fuel cell configured to supply electric power to the electric motor and the electric power storage device may be applied. In this way, any type of vehicle may be applied as long as an electric power storage device and an electric motor configured to input and output power for traveling are provided.

The correspondence relationship between the primary components of the example and the primary components of the present disclosure described in SUMMARY will be described. In the example, although the battery 50 is described as an "electric power storage device", the motor MG2 is described as an "electric motor", and the HVECU 70, the engine ECU 24, the motor ECU 40, and the battery ECU 52 are described as an "electronic control unit", this is an example of the present disclosure.

The correspondence relationship between the primary components of the example and the primary components of the present disclosure described in SUMMARY should not be considered to limit the components of the present disclosure described in SUMMARY since the example is merely illustrative to specifically describe the aspects of the present disclosure. That is, the present disclosure described in SUMMARY should be interpreted based on the description in SUMMARY, and the example is merely a specific example of the present disclosure described in SUMMARY.

Although the mode for carrying out the present disclosure has been described above in connection with the example, an applicable embodiment of the present disclosure is not limited to the example, and can be of course carried out in various forms without departing from the spirit and scope of the present disclosure.

The embodiment of the present disclosure is usable in a manufacturing industry of a vehicle.

What is claimed is:

1. A vehicle comprising:
   an electric power storage device;
   an electric motor configured to generate power for traveling accompanied with discharging of the electric power storage device and to perform regenerative braking accompanied with charging of the electric power storage device; and
   an electronic control unit configured to:
   control charging and discharging of the electric power storage device such that a state of charge that is a ratio of an electric power storage amount stored in the electric power storage device to a total capacity of the electric power storage device becomes a target state of charge;
   determine whether or not a degree of deterioration of the electric power storage device due to unevenness in salt concentration is equal to or larger than a predetermined degree;
   when the degree of deterioration is equal to or larger than the predetermined degree and the state of charge is equal to or less than a predetermined requested state of charge, set the target state of charge such that the target state of charge increases monotonically; and set an increase amount or an increase rate of the monotonic increase to be larger as the degree of deterioration is larger.

2. The vehicle according to claim 1, wherein:

the electronic control unit is configured to set the increase amount to be larger as the degree of deterioration is larger; and the electronic control unit is configured to set a larger value out of a previous value of the target state of charge and a value obtained by adding the set increase amount to a current state of charge as a new target state of charge.

3. The vehicle according to claim 1, wherein the electronic control unit is configured to, when regenerative braking of the electric motor is requested, set the target state of charge to monotonically increase with a given increase amount from a target state of charge set immediately before a start of the regenerative braking until the request of the regenerative braking is released.

4. The vehicle according to claim 1, wherein the electronic control unit is configured to set the target state of charge to monotonically increase with a smaller increase amount or a smaller increase rate as a difference between a current state of charge and the requested state of charge is smaller.

5. The vehicle according to claim 1, further comprising: an internal combustion engine, wherein:

the electronic control unit is configured to, when the degree of deterioration is less than the predetermined degree, as a traveling mode, selectively set either of an electrically powered traveling priority mode in which electrically powered traveling is given priority over hybrid traveling or a hybrid traveling priority mode in which the hybrid traveling is given priority over the electrically powered traveling, the electrically powered traveling is a traveling state in which traveling is performed with power input and output from the electric motor exclusively in a state in which operation of the internal combustion engine is stopped, and the hybrid traveling is a traveling state in which traveling is performed using power from the internal combustion engine and power input and output from the electric motor; and the electronic control unit is configured to, when the degree of deterioration is equal to or larger than the predetermined degree, as the traveling mode, set the hybrid traveling priority mode.

6. The vehicle according to claim 1, further comprising: an internal combustion engine, wherein:

the electronic control unit is configured to, in a case where the vehicle travels using power from the internal combustion engine and power from the electric motor, set requested traveling power requested for traveling based on an accelerator operation amount;

the electronic control unit is configured to set requested charging and discharging power requested for charging and discharging the electric power storage device based on a current state of charge and the target state of charge;

the electronic control unit is configured to set requested engine power requested for the internal combustion engine based on the requested traveling power and the requested charging and discharging power;

the electronic control unit is configured to control the internal combustion engine and the electric motor such that the requested engine power is output from the internal combustion engine and the vehicle travels with the requested traveling power; and the electronic control unit is configured to, when the degree of deterioration is equal to or larger than the predetermined degree, set the requested charging and discharging power such that charging power in a case of charging the electric power storage device becomes larger than when the degree of deterioration is less than the predetermined degree.

* * * * *